(12) United States Patent
Mocatta et al.

(10) Patent No.: US 11,542,432 B2
(45) Date of Patent: Jan. 3, 2023

(54) METHOD FOR SYNTHESIZING A SEMICONDUCTING NANOSIZED MATERIAL

(71) Applicant: MERCK PATENT GMBH, Darmstadt (DE)

(72) Inventors: David Mocatta, Gadera (IL); Amir Holtzman, Rehovot (IL); Inbal Davidi, Modiin (IL); Shany Neyshtadt, Haifa (IL)

(73) Assignee: MERCK PATENT GMBH, Darmstadt (DE)

( * ) Notice: Subject to any disclaimer, the term of this patent is extended or adjusted under 35 U.S.C. 154(b) by 418 days.

(21) Appl. No.: 16/615,678

(22) PCT Filed: May 22, 2018

(86) PCT No.: PCT/EP2018/063273
§ 371 (c)(1),
(2) Date: Nov. 21, 2019

(87) PCT Pub. No.: WO2018/215396
PCT Pub. Date: Nov. 29, 2018

(65) Prior Publication Data
US 2020/0102494 A1    Apr. 2, 2020

Related U.S. Application Data

(60) Provisional application No. 62/509,869, filed on May 23, 2017, provisional application No. 62/509,903, filed on May 23, 2017.

(51) Int. Cl.
| | | |
|---|---|---|
| *C09K 11/62* | (2006.01) |
| *C09K 11/02* | (2006.01) |
| *C09K 11/08* | (2006.01) |
| *C09K 11/56* | (2006.01) |
| *H01L 33/50* | (2010.01) |
| *C09K 11/74* | (2006.01) |

(52) U.S. Cl.
CPC .......... *C09K 11/623* (2013.01); *C09K 11/025* (2013.01); *C09K 11/0811* (2013.01); *C09K 11/0883* (2013.01); *C09K 11/565* (2013.01); *C09K 11/7492* (2013.01); *H01L 33/502* (2013.01)

(58) Field of Classification Search
CPC ........................ C09K 11/7492; C09K 11/0883
See application file for complete search history.

(56) References Cited

U.S. PATENT DOCUMENTS

| | | | | |
|---|---|---|---|---|
| 8,900,489 B2 * | 12/2014 | Taylor | ..................... | H01L 33/06 977/773 |
| 9,529,228 B2 | 12/2016 | Banin et al. | | |
| 2010/0159248 A1 * | 6/2010 | Jang | ..................... | C09K 11/025 977/774 |
| 2012/0025139 A1 * | 2/2012 | Taylor | .................. | C09K 11/623 423/351 |

FOREIGN PATENT DOCUMENTS

WO          12059931 A1    5/2012
WO     WO 2017/074897   *  5/2017

OTHER PUBLICATIONS

Dylan C. Gary et al: "Single-Crystal and Electronic Structure of a 1.3 nm Indium Phosphide Nanocluster", Journal of the American Chemical Society, vol. 138, No. 5, Jan. 27, 2016 (Jan. 27, 2016), US, pp. 1510-1513, XP055462434, ISSN: 0002-7863.
Dylan C. Gary et al: "Two-Step Nucleation and Growth of InP Quantum Dots via Magic-Sized Cluster Intermediates", Chemistry of Materials, vol. 27, No. 4, Feb. 10, 2015 (Feb. 10, 2015), pp. 1432-1441, XP055462428, ISSN: 0897-4756.
International Search Report PCT/EP2018/063273 dated Aug. 31, 2018 (pp. 1-3).
Pietra et al., "Tuning the Lattice Parameter of InxZnyP for Highly Luminescent Lattice-Matched Core/Shell Quantum Dots" ACS Nano, vol. 10, No. 4, 2016, pp. 4754-4762.
X. Yang et al., "Full Visible Range Covering InP/ZnS Nanocrystals with High Photometric Performance and Their Application to White Quantum Dot Light-Emitting Diodes" Adv. Mater., vol. 24, 2012, pp. 4180.

* cited by examiner

*Primary Examiner* — C Melissa Koslow
(74) *Attorney, Agent, or Firm* — Millen White Zelano and Branigan, PC; Csaba Henter

(57) ABSTRACT

The present invention relates to a method for synthesizing a semiconducting nanosized material.

26 Claims, 2 Drawing Sheets

Working Example 13:

Working Example 14:

METHOD FOR SYNTHESIZING A SEMICONDUCTING NANOSIZED MATERIAL

FIELD OF THE INVENTION

The present invention relates to a method for synthesizing a semiconducting nanosized material, a semiconducting nanosized material obtainable by the method, optical medium and an optical device.

BACKGROUND ART

Quantum dots have large potential for use in display technologies due to their high quantum yields and narrow emission line-widths, which allow a large colour gamut to be attained. Cadmium based quantum dots have traditionally given the highest quantum yields and the lowest emission line-widths. However, recent health and safety regulations have limited the use of cadmium and so cadmium free alternatives are preferred.

Unfortunately, the leading cadmium free alternative, InP, shows significantly larger line widths than cadmium based materials. Spectroscopic evidence of single InP quantum dot line widths show that they are comparable to cadmium based materials. This fact suggests that the cause of the large line-widths exhibited by InP based quantum dots ensembles is the inhomogeneous broadening stemming from the large size distribution of the InP quantum dots. The inhomogeneous broadening in InP has two contributing factors one is the use of the highly reactive tris(trimethylsilyl)phoshine (PTMS) as the phosphorous precursor in most syntheses. The reactivity of the PTMS makes it hard to separate the nucleation and growth stages which is necessary to produce quantum dots with tight size distributions like those achieved with cadmium based materials.

Due to this most syntheses of InP core/shell dots give an FWHM for the final photoluminescence peak of >40 nm. One paper by X. Yang et al. gives an FWHM of 38 nm[1]. In these syntheses the FWHM of the final core/shell is largely determined by the size distribution of the InP cores and this ultimately limits the FWHM breadth.

Similarly, a document published by P. Ramasamy et al. discloses core/shell quantum dots having an InZnP core[2].

On top of this the quantum yield of the final InP/ZnS or InP/ZnSe quantum dots is partially determined by the lattice mismatch between the InP core and the ZnS or ZnSe shell. This mismatch can be tuned by controlling the amount of zinc in the InP core[3].

Recently a method for synthesizing InP quantum dots is reported[4]. This method uses InP magic sized clusters (MSCs) as single source precursors (SSP) instead of the PTMS and indium-carboxylate.

PRIOR ART

1. X. Yang et al., *Adv. Mater.*, 2012, 24, 4180
2. Ramasamy et al., *Chem Mater,* 2017, 29, 6893
3. F. Pietra et al. *ACS Nano,* 2016, 10 (4), pp 4754-4762)
4. D. Gary et al., *Chem. Mater.,* 2015, 1432

Quantum dots obtainable according to prior art documents could be used. However, it is a permanent desire to improve the features of these quantum dots.

Therefore, it is an object of embodiments of the present invention to provide quantum dots having a high quantum yield, a high absorption, improved color purity and efficiency.

It is an object of embodiments of the present invention to provide an efficient and/or cheap method for production of improved quantum dots.

The above objective is accomplished by quantum dots and a method for producing the same according to the present invention.

SUMMARY OF THE INVENTION

Surprisingly, the inventors have found that a method for synthesizing a semiconducting nanosized material comprising at least three components as disclosed herein solves one or more of the problems mentioned above.

Consequently, the present invention provides a method for synthesizing a semiconducting nanosized material comprising at least three components, wherein the method comprises the steps of i) providing a first precursor and a second precursor or a semiconducting nanosized material being obtainable by reacting the first precursor and the second precursor;

ii) providing a third precursor;

iii) reacting the third precursor with the first precursor and the second precursor or reacting the third precursor with a nanosized material being obtainable by reacting the first precursor and the second precursor in order to achieve a semiconducting nanosized material comprising at least three components characterized in that the first precursor is a source of an element of the group 13 of the periodic table, preferably a salt of an element of the group 13 of the periodic table, more preferably the element of the group 13 is In, Ga or a mixture of thereof;

the second precursor is a source of an element of the group 15 of the periodic table, preferably the element of the group 15 is P, As or a mixture of thereof; and the third precursor is a Zn, Cd or a Ga source, preferably a material selected from one or more members of the group consisting of Zinc salts, Cadmium salts and Gallium salts or mixtures thereof, preferably Zinc halogenides, Cadmium halogenides, Gallium halogenides, Zinc carboxylates, Cadmium carboxylates, and Gallium carboxylates or mixtures thereof, more preferably $ZnCl_2$, $ZnBr_2$, $ZnI_2$, $Zn(O_2CR)_2$, wherein R is a $C_1$ to $C_{25}$ group, preferably a $C_1$ to $C_{19}$ group, $GaCl_3$, $GaBr_3$, $GaCl_3$, $Ga(O_2CR)_3$, wherein R is a $C_1$ to $C_{25}$ group, preferably a $C_1$ to $C_{19}$ group, even more preferably Zinc acetate, Zinc myristate, Zinc stearate, Gallium acetate, Gallium myristate and Gallium stearate. Preferably said method of the present invention solves all the problems mentioned above at the same time.

In another aspect, the present invention relates to a method for synthesizing a semiconducting nanosized material comprising at least three components being based on magical sized clusters (MSCs).

In another aspect, the present invention also relates to a semiconducting nanosized material, preferably a semiconducting light emitting nanosized material, more preferably quantum dots (QD) being obtainable by a method for synthesizing a semiconducting nanosized material comprising at least three components.

In another aspect, the present invention further relates to composition comprising the semiconducting nanosized material comprising at least three components, and at least one additional material, preferably the additional material is selected from the group consisting of organic light emitting materials, inorganic light emitting materials, charge transporting materials, scattering particles, host materials, and matrix materials.

In another aspect, the present invention further relates to formulation composition comprising or consisting of the semiconducting nanosized material comprising at least three components, and at least one solvent.

In another aspect, the present invention also relates to use of the semiconducting nanosized material comprising at least three components, or the composition, or the formulation, in an electronic device, optical device or in a biomedical device.

In another aspect, the present invention relates to an optical medium comprising a semiconducting nanosized material comprising at least three components.

In another aspect, the present invention also relates to an optical device comprising the optical medium.

DETAILED DESCRIPTION OF THE INVENTION

Figure 1:
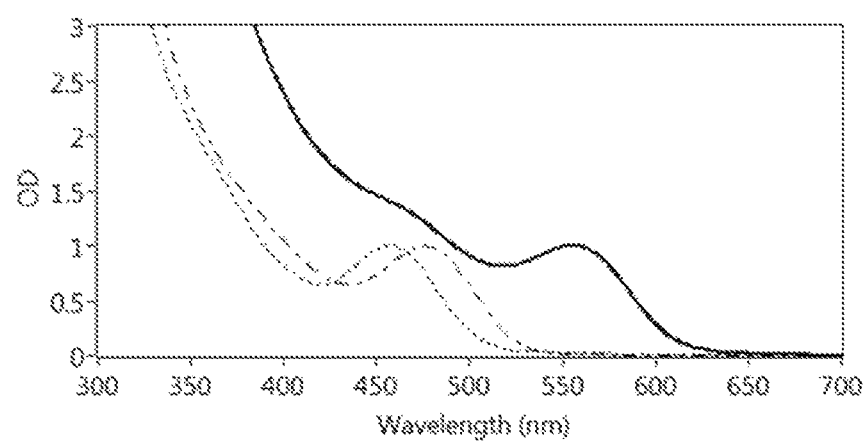
FIG. 1 illustrates exciton at 476nm with max/min of 1.5.

The present invention provides a method for synthesizing a semiconducting nanosized material comprising at least three components, wherein the method comprises the steps of i) providing a first precursor and a second precursor or a semiconducting nanosized material being obtainable by reacting the first precursor and the second precursor;

ii) providing a third precursor;

iii) reacting the third precursor with the first precursor and the second precursor or reacting the third precursor with a nanosized material being obtainable by reacting the first precursor and the second precursor in order to achieve a semiconducting nanosized material comprising at least three components characterized in that the first precursor is a source of an element of the group 13 of the periodic table, preferably a salt of an element of the group 13 of the periodic table, more preferably the element of the group 13 is In, Ga or a mixture of thereof;

the second precursor is a source of an element of the group 15 of the periodic table, preferably the element of the group 15 is P, As or a mixture of thereof; and the third precursor is a Zn, Cd or a Ga source, preferably a material selected from one or more members of the group consisting of Zinc salts, Cadmium salts and Gallium salts or mixtures thereof, preferably Zinc halogenides, Cadmium halogenides, Gallium halogenides, Zinc carboxylates, Cadmium carboxylates, and Gallium carboxylates or mixtures thereof, more preferably $ZnCl_2$, $ZnBr_2$, $ZnI_2$, $Zn(O_2CR)_2$, wherein R is $C_1$ to $C_{25}$, preferably $C_1$ to $C_{19}$, $GaCl_3$, $GaBr_3$, $GaCl_3$, $Ga(O_2CR)_3$, wherein R is $C_1$ to $C_{25}$, preferably $C_1$ to $C_{19}$, even more preferably Zinc acetate, Zinc myristate, Zinc stearate, Gallium acetate, Gallium myristate and Gallium stearate.

In an embodiment of the present invention, the first precursor, the second precursor and the third precursor can be mixed and reacted to a semiconducting nanosized material comprising at least three components in one step. The expression "reacted to a semiconducting nanosized material comprising at least three components in one step" means that the product is formed using the three precursors without forming intermediate products which could be isolated but the three precursors are mixed and reacted, preferably at the same time. Consequently, in that embodiment, the three precursors are preferably different.

Preferably, the first precursor for forming a semiconducting nanosized material comprising at least three components is a source of an element of the group 13 of the periodic table, preferably a salt of an element of the group 13 of the periodic table, more preferably the element of the group 13 is In, Ga or a mixture of thereof.

Preferably, the reaction mixture comprises at least 0.01% by weight of the first precursor, more preferably at least 0.05% by weight, even more preferably at least 0.1% by weight, even more preferably at least 0.5% by weight. Preferably, the reaction mixture comprises at most 20% by weight of the first precursor, more preferably at most 10% by weight, even more preferably at most 5% by weight.

Preferably, the reaction mixture comprises the first precursor in a range of from 0.01 to 10% by weight, more preferably from 0.05 to 5% by weight, even more preferably 0.07 to 2.5% by weight, most preferably 0.1 to 2% by weight, based on the total weight of the mixture.

Preferably, the preparation of the semiconducting nanosized material comprising at least three components is achieved by a reaction mixture comprising an indium precursor preferably being selected from the group consisting of indium carboxylates, more preferably indium carboxylates having 2 to 30 carbon atoms, preferably 4 to 24 carbon atoms, even more preferably 8 to 20 carbon atoms, most preferably 10 to 16 carbon atoms.

The indium carboxylate is preferably selected from the group consisting of indium myristate, indium laurate, indium palmitate, indium stearate and indium oleate.

Preferably, the preparation of the semiconducting nanosized material comprising at least three components is achieved by a reaction mixture comprising an gallium precursor preferably being selected from the group consisting of gallium carboxylates, more preferably gallium carboxylates having 2 to 30 carbon atoms, preferably 4 to 24 carbon atoms, even more preferably 8 to 20 carbon atoms, most preferably 10 to 16 carbon atoms.

Preferably, the second precursor for forming a semiconducting nanosized material comprising at least three components is a source of an element of the group 15 of the periodic table, preferably the element of the group 15 is P, As or a mixture of thereof.

Preferably, the reaction mixture comprises at least 0.01% by weight of the second precursor, more preferably at least 0.05% by weight, even more preferably at least 0.07% by weight, even more preferably at least 0.1% by weight. Preferably, the reaction mixture comprises at most 20% by weight of the second precursor, more preferably at most 10% by weight, even more preferably at most 5% by weight.

Preferably, the reaction mixture comprises the second precursor in a range of from 0.01 to 20% by weight, more preferably from 0.05 to 10% by weight, even more preferably 0.07 to 7.5% by weight, most preferably 0.1 to 5% by weight, based on the total weight of the mixture.

Preferably, the preparation of the semiconducting nanosized material comprising at least three components is achieved by a reaction mixture comprising a phosphorus precursor being selected from the group consisting of organic phosphine compounds, preferably alkylsilyl phosphine compounds having 1 to 3 silicon atoms preferably alkylsilyl phosphine compounds having 1 to 30 carbon atoms, preferably 1 to 10 carbon atoms, even more preferably 1 to 4 carbon atoms, most preferably 1 or 2 carbon atoms in the alkyl groups or aryl silyl phosphine compounds, preferably aryl silyl phosphine compounds having 1-3 silicon atoms preferably aryl silyl phosphine compounds having 6 to 30 carbon atoms, preferably 6 to 18 carbon atoms, even more preferably 6 to 12 carbon atoms, most preferably 6 or 10 carbon atoms in the aryl groups.

In a specific embodiment, the preparation of the semiconducting nanosized material comprising at least three components is preferably achieved by a reaction mixture comprising a phosphorus precursor and an indium precursor being different to the phosphorus precursor and the molar ratio of the phosphorus precursor to the indium precursor is preferably in the range of 1:3 to 1:1, preferably 1:2.5 to 1:1, even more preferably 1:2 to 1:1.

Preferably, the phosphorous precursor comprises tris(trimethylsilyl)phosphine and similar materials having an aryl, and/or alkyl group instead of the methyl unit, such as tris(triphenylsilyl)phosphine, tris(triethylsilyl)phosphine, tris(diphenylmethylsilyl)phosphine, tris(phenyldimethylsilyl)phosphine, tris(triphenylsilyl)phosphine, tris(triethylsilyl)phosphine, tris(diethylmethylsilyl)phosphine, tris(ethyldimethylsilyl)phosphine.

Preferably, the third precursor for forming a semiconducting nanosized material comprising at least three components is a Zn, Cd or a Ga source, preferably a material selected from one or more members of the group consisting of Zinc salts, Cadmium salts and Gallium salts or mixtures thereof, preferably Zinc halogenides, Cadmium halogenides, Gallium halogenides, Zinc carboxylates, Cadmium carboxylates, and Gallium carboxylates or mixtures thereof, more preferably $ZnCl_2$, $ZnBr_2$, $ZnI_2$, $Zn(O_2CR)_2$, wherein R is a $C_1$ to $C_{25}$ group, preferably a $C_1$ to $C_{19}$ group, $GaCl_3$, $GaBr_3$, $GaCl_3$, $Ga(O_2CR)_3$, wherein R is a $C_1$ to $C_{25}$ group, preferably a $C_1$ to $C_{19}$ group, even more preferably Zinc acetate, Zinc myristate, Zinc stearate, Gallium acetate, Gallium myristate and Gallium stearate.

The expression "$C_1$ to $C_{25}$ group, preferably $C_1$ to $C_{19}$ group" means a residues comprising 1 to 25 carbon atoms and 1 to 19 carbon atoms, respectively. Preferably, the $C_1$ to $C_{25}$ group, preferably $C_1$ to $C_{19}$ group is an alkyl residue or an aromatic residue, such as methyl, ethyl, hexyl, heptyl, octanyl, nonanyl, decanyl, undecanyl, dodecanyl, tridecanyl, tetradecanyl, pentadecanyl, hexadecanyl, heptadecanyl, octadecanyl, nonadecanyl, phenyl, methylphenyl, ethylphenyl.

Preferably, the reaction mixture comprises at least 0.01% by weight of the third precursor, more preferably at least 0.05% by weight, even more preferably at least 0.1% by weight, even more preferably at least 0.5% by weight. Preferably, the reaction mixture comprises at most 20% by weight of the third precursor, more preferably at most 10% by weight, more preferably at most 7.5% by weight, even more preferably at most 5% by weight.

Preferably, the reaction mixture comprises the third precursor in a range of from 0.01 to 20% by weight, more preferably from 0.05 to 10% by weight, even more preferably 0.07 to 7.5% by weight, most preferably 0.1 to 5% by weight, based on the total weight of the mixture.

Preferably, the reaction mixture for obtaining the semiconducting nanosized material comprising at least three components comprises a solvent, preferably a solvent exhibiting a boiling point of 250° C. or more, more preferably a solvent exhibiting a boiling point in the range from 250° C. to 500° C., preferably in the range from 300° C. to 480° C., more preferably it is from 350° C. to 450° C., even more preferably it is from 370° C. to 430° C.

It can be provided that the solvent is preferably selected from amines, aldehydes, alcohols, ketones, ethers, esters, amides, sulfur compounds, nitro compounds, hydrocarbons, halogenated hydro-carbons (e.g. chlorinated hydrocarbons), aromatic or heteroaromatic hydrocarbons, halogenated aromatic or heteroaromatic hydrocarbons and/or (cyclic) siloxanes, preferably cyclic hydrocarbons, terpenes, epoxides, ketones, ethers and esters; more preferably the solvent is selected from one or more members of the group consisting of squalenes, squalanes, heptadecanes, octadecanes, octadecenes, nonadecanes, icosanes, henicosanes, docosanes, tricosanes, pentacosanes, hexacosanes, octacosanes, nonacosanes, triacontanes, hentriacontanes, dotriacontanes, tritriacontanes, tetratriacontanes, pentatriacontanes, hexatriacontanes, oleylamines, and trioctylamines, even more preferably squalene, squalane, heptadecane, octadecane, octadecene, nonadecane, icosane, henicosane, docosane, tricosane, pentacosane, hexacosane, octacosane, nonacosane, triacontane, hentriacontane, dotriacontane, tritriacontane, tetratriacontane, pentatriacontane, hexatriacontane, oleylamine, and trioctylamine, even more preferably squalane, pentacosane, hexacosane, octacosane, nonacosane, or triacontane, even more preferably squalane, pentacosane, or hexacosane.

Preferably, an alkane, more preferably a squalane is used as a solvent for the preparation of the semiconducting nanosized material comprising at least three components. Preferably, an alkane having 6 to 46 carbon atoms, more preferably 8 to 40 carbon atoms, even more preferably 12 to 34 carbon atoms, most preferably 16 to 30 carbon atoms is used as a solvent. More preferably, the alkane being used as a solvent is a decane, dodecane, tetradecane, hexadecane, octadecane, eicosane. docosane, hexamethyltetracosane. The alkane may be linear or branched with branched alkanes such as squalene being preferred.

In an embodiment of the present invention, the preparation of the semiconducting nanosized material comprising at least three components is preferably achieved by a reaction mixture comprising a solvent and the solvent comprises at least one alkene, preferably an alkene having 6 to 36 carbon atoms, more preferably 8 to 30 carbon atoms, even more preferably 12 to 24 carbon atoms, most preferably 16 to 20 carbon atoms. More preferably, the alkene is a 1-alkene, such as 1-decene, 1-dodecene, 1-Tetradecene, 1-hexadecene, 1-octadecene, 1-eicosene. 1-docosene. The alkene may be linear or branched.

Preferably, the reaction mixture comprises at least 10% by weight of a solvent, more preferably at least 50% by weight, even more preferably at least 70% by weight, even more preferably at least 80% by weight. The residual is provided by the further components of the reaction mixture as described above and below.

Preferably, the reaction mixture comprises a solvent in a range of from 60 to 99.5% by weight, more preferably from 70 to 99% by weight, even more preferably 80 to 98% by weight, based on the total weight of the mixture.

Preferably the reaction mixture for obtaining the semiconducting nanosized material comprises a ligand. Therefore, the reaction mixture of the first step, the second step or the reaction mixture comprising a first precursor, a second precursor and a third precursor preferably comprises a ligand.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tetradecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), alkenes, such as 1-Octadecene (ODE), thiols such as hexadecane thiol and hexane thiol; mercapto carboxylic acids such as mercapto propionic acid and mercaptoundecanoicacid; carboxylic acids such as oleic acid, stearic acid, myristic acid; acetic acid and a combination of any of these. Polyethylenimine (PEI) also can be used preferably.

The ligands mentioned above, especially the acids, can be used in acidic form and/or as a salt. The person skilled in the art will be aware that the ligand will bind to the core in an appropriate manner, e.g. the acids may get deprotonated.

Examples of surface ligands have been described in, for example, the laid-open international patent application No. WO 2012/059931A.

Preferably, the QD comprise a carboxylate ligand, more preferably a carboxylate ligand having 2 to 30 carbon atoms, preferably 4 to 26 carbon atoms, even more preferably 8 to 22 carbon atoms, most preferably 10 to 18 carbon atoms, even more preferably a carboxylate ligand selected from the group consisting of myristate, palmitate, laurate, stearate, oleate; and/or a phosphorus containing ligand, such as phosphine ligands, preferably alkyl phosphine ligands having 3 to 108 carbon atoms, e. g. Trioctylphosphine (TOP), phosphine oxide ligands, preferably alkyl phosphine oxide having 3 to 108 carbon atoms and/or phosphonate ligands, more preferably an alkyl phosphonate ligand having 1 to 36 carbon atoms, preferably 6 to 30 carbon atoms, even more preferably 10 to 24 carbon atoms, most preferably 12 or 20 carbon atoms in the alkyl group even more preferably a phosphonate ligand selected from the group consisting of octadecylphosphonate, dodecylphosphonate, tetradecylphosphonate, hexadecylphosphonate; and/or amines, preferably primary or secondary amines having 1-36 carbon atoms, preferably 6 to 30.

In view of the ligands mentioned above, carboxylate ligands such as stearate and oleate and phosphine ligands, such as Trioctylphosphine oxide (TOPO), Trioctylphosphine (TOP), and Tributylphosphine (TBP) are preferred.

Preferably, the third precursor is reacted with the first precursor and the second precursor or a nanosized material being obtainable by reacting the first precursor and the second precursor at a reaction temperature in the range from 100° C. to 500° C., preferably in the range from 120° C. to 450° C., more preferably it is from 130° C. to 400° C., further more preferably from 150° C. to 380° C.

In a further embodiment, third precursor is reacted with the first precursor and the second precursor at a temperature in the range from 60° C. to 250° C., preferably in the range from 80° C. to 220° C., more preferably it is from 110° C. to 200° C. to allow a creation and growth of the semiconducting nanosized material, preferably semiconducting nanosized cluster in the mixture.

In a further embodiment, the present invention provides a method for synthesizing a semiconducting nanosized material, wherein the method comprises following steps, (a) providing at least a first, a second and a third cluster precursor, wherein said first cluster precursor is a salt of the element of the group 12 of the periodic table, and said second cluster precursor is a source of an element of the group 15 of the periodic table, and said third cluster precursor is a material selected from one or more members of the group consisting of Zinc salts, Zinc carboxylates, Cadmium salts, and Cadmium carboxylates, preferably the element of the group 13 is In, Ga or a mixture of thereof, the element of the group 15 is P, or As, and the material is $ZnCl_2$, $ZnBr_2$, $ZnI_2$, Zn-acetate, Zn-myristate, or Zn—$O_2$CR where R is an alkyl chain having 1 to 19, preferably 2 to 18 carbon atoms, at the same time or each separately, to an another compound or to an another mixture of compounds, in order to get a reaction mixture, (b) adjusting or keeping the temperature of the reaction mixture obtained in step (a) in the range from 60° C. to 250° C., preferably in the range from 80° C. to 220° C., more preferably it is from 110° C. to 200° C. to allow a creation and growth of the semiconducting nanosized material, preferably semiconducting nanosized cluster in the mixture, (c) cooling the reaction mixture to stop the growth of said semiconducting nanosized material, preferably semiconducting nanosized cluster in step (b).

In a preferred embodiment of the present invention, said another compound is a solvent.

In a preferred embodiment of the present invention, said another compound is a solvent having the boiling point as mentioned above and below.

In a preferred embodiment of the present invention, said another compound is a solvent selected from one or more members of the group consisting of squalenes, squalanes, heptadecanes, octadecanes, octadecenes, nonadecanes, icosanes, henicosanes, docosanes, tricosanes, pentacosanes, hexacosanes, octacosanes, nonacosanes, triacontanes, hentriacontanes, dotriacontanes, tritriacontanes, tetratriacontanes, pentatriacontanes, hexatriacontanes, oleylamines, and trioctylamines, preferably squalene, squalane, heptadecane, octadecane, octadecene, nonadecane, icosane, henicosane, docosane, tricosane, pentacosane, hexacosane, octacosane, nonacosane, triacontane, hentriacontane, dotriacontane, tritriacontane, tetratriacontane, pentatriacontane, hexatriacontane, oleylamine, and trioctylamine, more preferably squalane, pentacosane, hexacosane, octacosane, nonacosane, or triacontane, even more preferably squalane, pentacosane, or hexacosane.

Preferably, said first, second and third precursors as described above and below are used first, second and third cluster precursors, respectively.

In a preferred embodiment, said first precursor and said second precursor are reacted to a nanosized material in a first step and the nanosized material of the first step is reacted with the third precursor in a second step to obtain a semiconducting nanosized material comprising at least three components. Preferably, the nanosized material of the first step is injected to a composition comprising the third precursor. In a further embodiment, the nanosized material of the first step is preferably injected to a composition comprising the third precursor in at least two portions, more preferably in at least three portions.

Preferably, the nanosized material of the first step is reacted with the third precursor in a concentration of at least 0.1 mg/ml, preferably at least 0.5 mg/ml, more preferably at least 1.0 mg/ml, based on the concentration of the nanosized material obtainable in the first step.

Preferably, the nanosized material of the first step is reacted with the third precursor in a concentration in a range of from 0.5 to 30 mg/ml, more preferably from 1 to 20 mg/ml, even more preferably 1 to 15 mg/ml, most preferably 1 to 10 mg/ml.

Preferably, the nanosized material of the first step is reacted with the third precursor wherein the weight ratio of the nanosized material of the first step to the third precursor is in a range of 10:1 to 1:20, preferably 2.5:1 to 1:10, more preferably 1:1.5 to 1:6.

In a further embodiment, the molar ratio of third precursor to the second precursor is preferably in the range of 10:1 to 1:15, preferably 10:1 to 1:10, more preferably 10:1 to 1.5:1.

Preferably, the molar ratio of third precursor to the nanosized material of the first step based on the content of the element of the group 15 is in the range of 50:1 to 1:10, preferably 10:1 to 1:5, more preferably 5.5:1 to 1:1.3, even more preferably 5.5:1 to 1.1:1.

Preferably, the molar ratio of third precursor to the nanosized material of the first step based on the content of the element of the group 15 is in the range of 5 to 150, preferably 5 to 120, more preferably 10 to 120, even more preferably 15 to 110.

Preferably, the reaction mixture comprises at least 0.1% by weight of the nanosized material of the first step, more preferably at least 0.25% by weight, even more preferably at least 0.5% by weight, even more preferably at least 1.0% by weight. Preferably, the reaction mixture comprises at most 20% by weight of the nanosized material of the first step, more preferably at most 10% by weight, even more preferably at most 5% by weight.

Preferably, the reaction mixture comprises the nanosized material of the first step in a range of from 0.1 to 20% by weight, more preferably from 0.25 to 15% by weight, even more preferably from 0.5 to 10% by weight, most preferably from 0.5 to 5% by weight, based on the total weight of the mixture.

It can be provided that the reaction temperature of the first step is preferably adjusted or kept in the range from 60° C. to 250° C., preferably in the range from 80° C. to 220° C., more preferably it is from 110° C. to 200° C. to allow a creation and growth of the semiconducting nanosized material in the mixture.

Preferably, the temperature of the reaction mixture of the first step, wherein a first precursor and a second precursor are reacted, is kept in the temperature range for from 1 second to 15 minutes, preferably from 1 second to 14 minutes, more preferably from 10 seconds to 12 minutes, even more preferably from 10 seconds to 10 minutes, further more preferably from 10 seconds to 5 minutes, the most preferably from 10 seconds to 120 seconds.

In an embodiment of the present method, the third precursor is preferably reacted with the first precursor and the second precursor or a nanosized material being obtainable by reacting the first precursor and the second precursor at a reaction temperature in the range from 250° C. to 500° C., preferably in the range from 280° C. to 450° C., more preferably it is from 300° C. to 400° C., further more preferably from 320° C. to 380° C.

In a specific embodiment of the present invention the temperature of the reaction mixture of the second step, wherein a third precursor and the reaction product of the first step are reacted is preferably kept in the temperature range for from 1 second to 3 hours, preferably from 5 seconds to 2.5 hours, more preferably from 20 seconds to 180 minutes, even more preferably from 30 seconds to 120 minutes, further more preferably from 45 seconds to 90 minutes, the most preferably from 60 seconds to 60 minutes.

In another aspect, the present invention also relates to a method for synthesizing a semiconducting nanosized material, wherein the method comprises following steps, (A1) preparing a semiconducting nanosized material, preferably semiconducting nanosized cluster by providing at least a first, and a second precursor, optionally in a solvent, wherein said first cluster precursor is a salt of the element of the group 12 of the periodic table, and said second cluster precursor is a source of an element of the group 15 of the periodic table, preferably the element of the group 13 is In, Ga or a mixture of thereof, the element of the group 15 is P, or As, at the same time or each separately, (A2) providing either the semiconducting nanosized material, preferably semiconducting nanosized cluster obtained in step (A1) and a material selected from one or more members of the group consisting of Zinc salts, Zinc carboxylates, Cadmium salts, Cadmium carboxylates, preferably, $ZnCl_2$, $ZnBr_2$, $ZnI_2$, Zn-acetate, Zn-myristate, Zn—$O_2$CR where R is an alkyl chain having 1 to 19, preferably 2 to 18 carbon atoms, at the same time or each separately, to an another compound or to an another mixture of compounds, in order to get a reaction mixture, (b) adjusting or keeping the temperature of the reaction mixture obtained in step (a) in the range from 60° C. to 500° C., preferably 80° C. to 400°, more preferably 60° C. to 250° C., even more preferably in the range from 80° C. to 220° C., even more preferably it is from 110° C. to 200° C. to allow a creation and growth of the semiconducting nanosized material, preferably semiconducting nanosized cluster in the mixture, (c) cooling the reaction mixture to stop the growth of said semiconducting nanosized material, preferably semiconducting nanosized cluster in step (b).

In a preferred embodiment of the present invention, said another compound is a solvent.

In a preferred embodiment of the present invention, said another compound is a solvent having the boiling point as mentioned above and below.

In a preferred embodiment of the present invention, said another compound is a solvent selected from one or more members as mentioned above especially with regard to a method comprising the steps (a), (b) and (c).

In a preferred embodiment the present invention also relates to a method for synthesizing a semiconducting nanosized material, wherein the method comprises following steps, (a1) providing either a III-V semiconducting nanosized material, preferably semiconducting nanosized cluster and a material selected from one or more members of the group consisting of Zinc salts, Zinc carboxylates, Cadmiumsalts, Cadmium carboxylates, preferably, $ZnCl_2$, $ZnBr_2$, $ZnI_2$, Zn-acetate, Zn-myristate, Zn-$O_2$CR where R is an alkyl chain having 1 to 19, preferably 2 to 18 carbon atoms, at the same time or each separately, to an another compound or to an another mixture of compounds, in order to get a reaction mixture, (b1) adjusting or keeping the temperature of the reaction mixture obtained in step (a) in the range from 250° C. to 500° C., preferably in the range from 280° C. to 450° C., more preferably it is from 300° C. to 400° C., further more preferably from 320° C. to 380° C. to allow a creation and growth of the semiconducting nanosized material in the mixture, (c1) cooling the reaction mixture to stop the growth of said semiconducting nanosized material in step (b1).

In a preferred embodiment of the present invention, said another compound is a solvent.

In a preferred embodiment of the present invention, said another compound is a solvent having the boiling point as mentioned above and below In a preferred embodiment of the present invention, said another compound is a solvent selected from one or more members as mentioned above especially with regard to a method comprising the steps (a), (b) and (c).

In a preferred embodiment of the present invention, the temperature of the reaction mixture in step (b1) is kept in the temperature range for from 1 second to 15 minutes, preferably from 1 second to 14 minutes, more preferably from 10 seconds to 12 minutes, even more preferably from 10 seconds to 10 minutes, further more preferably from 10 seconds to 5 minutes, the most preferably from 10 seconds to 120 seconds.

In a further preferred embodiment of the present invention, the temperature of the reaction mixture in step (b1) is kept in the temperature range for from 1 second to 3 hours, preferably from 5 seconds to 2.5 hours, more preferably from 20 seconds to 180 minutes, even more preferably from 30 seconds to 120 minutes, further more preferably from 45 seconds to 90 minutes, the most preferably from 60 seconds to 60 minutes.

In a preferred embodiment of the present invention, the material and the III-V semiconducting nanosized material, preferably semiconducting nanosized cluster are provided to the another compound or to the another mixture of compounds at the same time in step (a1).

In a preferred embodiment of the present invention, said III-V semiconducting nanosized material, preferably semiconducting nanosized cluster is a III-V magic sized cluster selected from the group consisting of InP, InAs, InSb, GaP, GaAs, and GaSb, magic sized clusters, preferably InP magic sized cluster, more preferably, it is $In_{37}P_{20}(O_2CR^1)_{51}$, wherein said $R^1$ of said $In_{37}P_{20}R^1_{51}$ is —$O_2CCH_2$Phenyl, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, palmitate, nonadecanoate, icosanoate or oleate.

In a preferred embodiment of the present invention, the reaction mixture comprises a ligand. In a preferred embodiment, the reaction mixture comprises a second ligand and a third ligand. Preferably said second ligand and said third ligand are, dependently or independently of each other, selected from one or more members of the group consisting of carboxylic acids, metal carboxylate ligands, phosphines, phosphonic acids, meta-phosphonates, amines, quaternary ammonium carboxylate salts, metal phosphonates and metal halides, preferably myristic acid, lauric acid, stearate, oleate, myristate, laurate, phenyl acetate indium myristate, or indium acetate.

In a preferred embodiment, the semiconducting nanosized material comprising at least three components are prepared by the use of magic sized clusters comprising indium phosphide, more preferably the semiconducting nanosized material comprising at least three components are prepared by the use of magic sized clusters essentially consisting of indium phosphide (MSC InP). Magic sized clusters (MSC) are well known in the art. MSC have a well-defined composition and exhibit remarkable thermodynamic stability relative to similar sizes.

Preferably, a magical size cluster (MSC) is formed in said first step, wherein a first precursor and a second precursor are reacted, preferably a magical size cluster comprising indium phosphide (MSC InP).

Preferably, the preparation of the magical size cluster (MSC) is formed in said first step is achieved at a temperature of 100° C. or above, preferably 105° C. or above, more preferably in the range of 105 to 140° C., more preferably 105 to 120° C.

Preferably, the preparation of the magical size cluster (MSC) is achieved in the presence of a carboxylate compound, more preferably carboxylate compound having 2 to 30 carbon atoms, preferably 4 to 26 carbon atoms, even more preferably 8 to 22 carbon atoms, most preferably 10 to 18 carbon atoms.

More preferably, the carboxylate compound is a saturated carboxylate compound. The carboxylate compound could be added to the reaction mixture as a free acid or as a salt. Preferably, the carboxylate compound is added as a precursor, preferably an indium precursor wherein preferred indium precursors are disclosed above and below.

The InP magic size cluster (MSC) being useful as starting material for the preparation of semiconducting nanosized material comprising at least three components, preferably quantum dots can be prepared by any method known in the art. Preferably, the preparation of the MSC InP is achieved by a reaction mixture comprising a phosphorus precursor as mentioned above.

In addition to a phosphorus precursor, the preparation of the MSC InP is preferably achieved by a reaction mixture comprising an indium precursor as mentioned above.

In a specific embodiment, the preparation of the MSC InP being useful for preparation of the semiconducting nanosized material comprising at least three components is preferably achieved by a reaction mixture comprising a phosphorus precursor and an indium precursor being different to the phosphorus precursor and the molar ratio of the phosphorus precursor to the indium precursor is preferably in the range of 1:3 to 1:1, preferably 1:2.5 to 1:1, even more preferably 1:2 to 1:1.

Surprising improvements can be obtained using a high reaction temperature for the preparation of the MSC InP being useful as starting material for the preparation of the semiconducting nanosized material comprising at least three components. Preferably, the preparation of the MSC InP is achieved at a temperature 110° C. or above, more preferably 115° C. or above. Preferably, the preparation of the MSC InP is achieved at a temperature in the range of 110 to 180° C., more preferably 115 to 140° C.

Preferably, the MSC InP being useful as starting material for the preparation of the semiconducting nanosized material comprising at least three components exhibits an Exciton Peak of at least 370 nm, preferably at least 380 nm, in the absorbance spectrum measured at 25° using a toluene solution.

These data concern the MSC InP being achieved by the methods mentioned above and below and being preferably used as a starting material for the preparation of QD having the features mentioned above and below and preferably comprising a shell. Preferably, the QD having a shell exhibits an Exciton Peak of between 400-650 nm, preferably between 440-600 nm, in the absorption spectrum measured at 25° using a toluene solution.

The preparation of the nanosized material in a first step by reacting a first and a second precursor, the preparing a semiconducting nanosized material, preferably semiconducting nanosized cluster by providing at least a first, and a second precursor and/or the preparation of an magical size cluster is preferably achieved using a solvent. The solvent is not specifically restricted. Preferably, the solvent is selected from the compounds mentioned above. Preferably a non-coordinating solvent is used.

Preferably, an alkane, more preferably a squalane is used as a solvent for the preparation of the nanosized material in a first step by reacting a first and a second precursor, the preparing a semiconducting nanosized material, preferably semiconducting nanosized cluster by providing at least a first, and a second precursor and/or the preparation of an magical size cluster. Preferably, an alkane having 6 to 46 carbon atoms, more preferably 8 to 40 carbon atoms, even more preferably 12 to 34 carbon atoms, most preferably 16 to 30 carbon atoms is used as a solvent. More preferably, the alkane being used as a solvent is a decane, dodecane, tetradecane, hexadecane, octadecane, eicosane. docosane, hexamethyltetracosane. The alkane may be linear or branched with branched alkanes such as squalene being preferred.

In an embodiment of the present invention, the preparation of the nanosized material in a first step by reacting a first and a second precursor, the preparing a semiconducting nanosized material, preferably semiconducting nanosized cluster by providing at least a first, and a second precursor and/or the preparation of an magical size cluster is preferably achieved by a reaction mixture comprising a solvent and the solvent comprises at least one alkene, preferably an alkene having 6 to 36 carbon atoms, more preferably 8 to 30 carbon atoms, even more preferably 12 to 24 carbon atoms, most preferably 16 to 20 carbon atoms. More preferably, the alkene is a 1-alkene, such as 1-decene, 1-dodecene, 1-Tetradecene, 1-hexadecene, 1-octadecene, 1-eicosene. 1-docosene. The alkene may be linear or branched.

Regarding the preparation step of the semiconducting nanosized material comprising at least three components and the MSC InP being useful as starting material for the preparation of the semiconducting nanosized material comprising at least three components, alkanes and/or alkenes are preferred in view of the other solvents mentioned above, more preferable a squalene is used.

In another embodiment, a purification step is preferably performed for purifying a particulate material before performing an additional reaction step. That is, the nanosized material obtained in a first step by reacting a first and a second precursor, the semiconducting nanosized material, preferably semiconducting nanosized cluster being obtained by providing at least a first, and a second precursor and/or the magical size cluster being used as starting material is preferably purified before any subsequent reaction and/or modification is performed. The purification is described in more detail above and below.

The purification is preferably performed by adding a solvent to the mixture obtained in the first reaction step comprising a particulate material and preferably precipitating the a particulate material. The particulate material is preferably the nanosized material obtained in a first step by reacting a first and a second precursor, the semiconducting nanosized material, preferably semiconducting nanosized cluster being obtained by providing at least a first, and a second precursor and/or the magical size cluster being used as starting material, and/or a semiconducting nanosized material comprising a shell.

Preferably, the method comprises the steps of
a) providing a III-V semiconducting nanosized material;
b) providing a third precursor;
c) reacting the III-V nanosized material with the third precursor in order to achieve a semiconducting nanosized material comprising at least three components.

Preferably, the reaction mixture comprises at least 0.1% by weight of the III-V semiconducting nanosized material, more preferably at least 0.25% by weight, even more preferably at least 0.5% by weight, even more preferably at least 1.0% by weight. Preferably, the reaction mixture comprises at most 20% by weight of the III-V semiconducting nanosized material, more preferably at most 10% by weight, even more preferably at most 5% by weight.

Preferably, the reaction mixture comprises the III-V semiconducting nanosized material in a range of from 0.1 to 20% by weight, more preferably from 0.25 to 15% by weight, even more preferably from 0.5 to 10% by weight, most preferably from 0.5 to 5% by weight, based on the total weight of the mixture.

Preferably, the III-V semiconducting nanosized material is injected to a composition comprising the third precursor.

Preferably, the III-V semiconducting nanosized material is injected to a composition comprising the third precursor in at least two portions.

Preferably, the III-V semiconducting nanosized material is reacted with the third precursor in concentration of at least 0.1 mg/ml, preferably at least 0.5 mg/ml, more preferably at least 1.0 mg/ml, based on the concentration of the III-V semiconducting nanosized material.

Preferably, the III-V semiconducting nanosized material is reacted with the third precursor in a concentration in a range of from 0.5 to 200 mg/ml, more preferably from 1 to 100 mg/ml, even more preferably 1 to 50 mg/ml.

Preferably, the III-V semiconducting nanosized material is reacted with the third precursor wherein the weight ratio of the III-V semiconducting nanosized material to the third precursor is in a range of 10:1 to 1:20, preferably 2.5:1 to 1:10, more preferably 1:1.5 to 1:6.

Preferably, the III-V semiconducting nanosized material is reacted with the third precursor wherein the weight ratio of the III-V semiconducting nanosized material to the third precursor is in a range 0.01 to 1, more preferable is 0.01 to 0.8, even more preferred range is 0.01 to 0.6, most preferable is 0.05 to 0.6.

Preferably, the molar ratio of third precursor to the III-V semiconducting nanosized material based on the content of the element of the group V is in the range of 10:1 to 1:10, preferably 10:1 to 1:5, more preferably 5.5:1 to 1:1.3, even more preferably 5.5:1 to 1.1:1.

Preferably, the III-V semiconducting nanosized material is a III-V magic sized cluster (MSC) selected from the group consisting of InP, InAs, InSb, GaP, GaAs, and GaSb, magic sized clusters (MSC), preferably InP magic sized cluster (MSC InP), more preferably, it is $In_{37}P_{20}(O_2CR^1)_{51}$, wherein said $O_2CR^1$ of said $In_{37}P_{20}(O_2CR^1)_{51}$ is —$O_2CCH_2$Phenyl, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate or oleate.

Preferably, the III-V semiconducting nanosized material is based on a nanocrystal core, which consists solely of fused 6-membered rings with all phosphorus atoms coordinated to four indium atoms in a pseudo-tetrahedral arrangement. The nanocrystal core preferably have the formula $[In_{21} P_{20}]^{3+}$, $[In_{42}P_{40}]^{6+}$, $[In_{63}P_{60}]^{9+}$, $[In_{84}P_{80}]^{12+}$, $[In_{95}P_{90}]^{15+}$, $[In_{31} P_{30}]^{3+}$, $[In_{41} P_{40}]^{3+}$, $[In_{51}P_{50}]^{3+}$, $[In_{61}P_{60}]^{3+}$, $[In_{71}P_{70}]^{3+}$, $[In_{81}P_{80}]^{3+}$, $[In_{91}P_{90}]^{3+}$. In this preferred embodiment the subset of atoms preferably possesses a $C_2$ rotation axis that bisects two phosphorus atoms and a single indium atom located at the center of the particle, and measures approximately 1.3 nm×1.0 nm×1.0 nm. A dihedral angle of 160±3° is consistent along the longest straight In—P. The average In—P bond length in the $[In_{21}P_{20}]^{3+}$. core is 2.528 Å (min 2.479 Å, max 2.624 Å), and the average P—In—P bond angle is 109.2° (min 97.7°, max)119.9°. Preferably, an additional 16 indium atoms are singly bound to this core through surface-exposed phosphorus atoms, with an average bond length of 2.482 Å (min 2.450 Å, max 2.515 Å). Preferably, the sum of the single-bond covalent radii for In and P is 2.53 Å and it is preferably inferred that the bonding in the inorganic core of this cluster may be best viewed as covalent in nature, with differences in bond lengths between In—P in the core and In—P at the surface arising from internal strain. The structure is preferably assessed using single-crystal X-ray diffraction at 25° C. as well known in the art. (see J. Am. Chem. Soc. 2016, 138, 1510-1513). It should be noted that the core of the present QD may comprise additional InP or areas having another structure. Preferably, the area comprising the preferred structure as mentioned above is at least 30% by volume, more preferably at least 50% by volume and even more preferably at least 70% by volume.

Preferably, the III-V semiconducting nanosized material, preferably semiconducting nanosized cluster, more preferably the III-V magic sized cluster (MSC), comprises an Indium based carboxylate ligand, preferably $In(O_2CR^1)_3$, wherein said $O_2CR^1$ of said $In(O_2CR^1)_3$ is —$O_2CCH_2$Phenyl, or a substituted or unsubstituted fatty acid such as hexanoate, heptanoate, octanoate, nonanoate, decanoate, undecanoate, dodecanoate, tridecanoate, tetradecanoate, pentadecanoate, hexadecanoate, heptadecanoate, octadecanoate, nonadecanoate, icosanoate or oleate.

Preferably, the third precursor is reacted with the III-V semiconducting nanosized material, preferably semiconducting nanosized cluster at a reaction temperature in the range from 250° C. to 500° C., preferably in the range from 280° C. to 450° C., more preferably it is from 300° C. to 400° C., further more preferably from 320° C. to 380° C.

Preferably, the temperature of the reaction mixture wherein the third precursor is reacted with the III-V semiconducting nanosized material, is kept in said temperature range for from 1 second to 3 hours, preferably from 5 seconds to 2.5 hours, more preferably from 20 seconds to 180 minutes, even more preferably from 30 seconds to 120 minutes, further more preferably from 45 seconds to 90 minutes, the most preferably from 60 seconds to 60 minutes.

Preferably, the III-V semiconducting nanosized material, preferably semiconducting nanosized cluster comprises a ligand.

Preferably, the ligand of the III-V semiconducting nanosized material, preferably semiconducting nanosized cluster is selected from one or more members of the group consisting of carboxylic acids, metal carboxylate ligands, phosphines, phosphonic acids, metal-phosphonates, amines, quaternary ammonium carboxylate salts, metal phosphonates and metal halides, preferably carboxylic acids such as oleic acid, acetic acid, stearic acid, myristic acid, lauric acid, carboxylates such as metal stearate, metal oleate, metal myristate, metal laurate, metal phenylate, metal acetate, more preferably indium myristate, or indium acetate; preferably phosphines and phosphine oxides such as Trioctylphosphine oxide (TOPO), Trioctylphosphine (TOP), and Tributylphosphine (TBP); phosphonic acids such as Dodecylphosphonic acid (DDPA), Tetradecylphosphonic acid (TDPA), Octadecylphosphonic acid (ODPA), and Hexylphosphonic acid (HPA); amines such as Oleylamine, Dodecyl amine (DDA), Tetradecyl amine (TDA), Hexadecyl amine (HDA), and Octadecyl amine (ODA), Oleylamine (OLA), alkenes, such as 1-Octadecene (ODE), thiols such as hexadecane thiol and hexane thiol; mercapto carboxylic acids such as mercapto propionic acid and mercaptoundecanoicacid; and a combination of any of these.

According to a preferred embodiment, the nanosized material of the first step and/or the III-V semiconducting nanosized material is used as a single source precursor. In a preferred embodiment a nanosized material being obtained in a first step by reacting a first and a second precursor as mentioned above and below, preferably magic sized clusters essentially consisting of indium phosphide (MSC InP) or a III-V semiconducting nanosized material is degraded and/or solved by appropriate reaction temperatures in order to provide a source for the first precursor and the second precursor. According to this embodiment of the present invention, the first precursor and the second precursor being provided by degrading the nanosized material of the first step and/or the III-V semiconducting nanosized material is reacted with the third precursor.

In a preferred embodiment of the method wherein the nanosized material being obtained in a first step by reacting a first and a second precursor as mentioned above and below and/or the III-V semiconducting nanosized material is used as a single source precursor the degraded single source precursor forms a nucleation particles with the third precursor. In an additional step the nucleation particles are enlarged by a growing step. Preferably, this could be achieved by a temperature profile and by adding additional educts.

Preferably, a composition comprising the third precursor is heated up to a temperature in the range of from 250° C. to 500° C., preferably in the range from 280° C. to 450° C., more preferably it is from 300° C. to 400° C., further more preferably from 320° C. to 380° C. and a nanosized material of the first step and/or a III-V semiconducting nanosized material is injected to a composition comprising the third precursor. After the injection of the nanosized material of the first step and/or the III-V semiconducting nanosized material, the temperature of the reaction mixture is preferably lowered for growing the particles to a desired volume. Preferably the growing is performed by stepwise adding further nanosized material of the first step and/or III-V semiconducting nanosized material. The growing of the particles is preferably achieved in a temperature range of 140° C. to 450° C., preferably in the range from 180° C. to 320° C., more preferably it is from 200° C. to 280° C.

The nucleation step is preferably achieved in a reaction time from 1 second to 15 minutes, preferably from 1 second to 14 minutes, more preferably from 10 seconds to 12 minutes, even more preferably from 10 seconds to 10 minutes, further more preferably from 10 seconds to 5 minutes, the most preferably from 10 seconds to 120 seconds.

The growing step is preferably achieved in a reaction time from 1 second to 3 hours, preferably from 5 seconds to 2.5 hours, more preferably from 20 seconds to 180 minutes, even more preferably from 30 seconds to 120 minutes, further more preferably from 45 seconds to 90 minutes, the most preferably from 60 seconds to 60 minutes.

According to a further aspect of the method of the present invention, a shell of a semiconductor is grown onto the semiconducting nanosized material comprising at least three components of the present invention as mentioned above and below.

The growing of a shell is different to a reaction of the third precursor with the first and second precursor, a nanosized material of the first step, or a III-V semiconducting nanosized cluster as mentioned above and below based on the used reaction mixtures and the reaction procedure. A particle comprising a shell comprises at least two different regions being characterized by a specific semiconductor composition. Before the growing of a shell, the semiconducting nanosized material comprising at least three components of the present invention is different thereto.

According to the present invention, the term "core/shell structure" means the structure having a core part and at least one shell part covering said core.

In some embodiments of the present invention, said core/shell structure can be core/one shell layer structure, core/double shells structure or core/multishells structure.

According to the present invention, the term "multishells" stands for the stacked shell layers consisting of three or more shell layers.

Each stacked shell layers of double shells and/or multishells can be made from same or different materials.

In some embodiments of the present invention, a quantum dot shell may comprise a shell of a semiconductor material comprising II-VI, III-V, or IV-IV semiconductors, or a combination of any of these.

In some embodiments, as a combination, ternary or quaternary materials of II, III, IV, V, VI materials of the periodic table can be used.

Preferably, the shell comprises or consists of a $1^{st}$ element of group 12 of the periodic table and a $2^{nd}$ element of group 16 of the periodic table, preferably, the $1^{st}$ element is Zn, and the $2^{nd}$ element is S, Se and/or the shell comprises or a consisting of a $1^{st}$ element of group 13 of the periodic table and a $2^{nd}$ element of group 15 of the periodic table, preferably, the $1^{st}$ element is In, and the $2^{nd}$ element is P, more preferably the shell comprises or a consisting of InP, GaP, ZnS, ZnSe or combinations of these materials, especially alloys of these materials, even more preferably ZnSe or ZnS or the shell comprises a mixture of ZnS and ZnSe.

For example, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnPS/ZnS, InZnP/ZnSe/ZnS, ZnSe/CdS, ZnSe/ZnS, GaP/ZnS, GaP/ZnSe, GaP/ZnSe/ZnS, GaZnP/ZnS, GaZnPS/ZnS, GaZnP/ZnSe/ZnS, InGaP/ZnS, InGaP/ZnSe, InGaP/ZnSe/ZnS, or combination of any of these, can be used preferably. Preferably, the semiconducting material does not comprise Cd, more preferably the semiconducting material of the shell comprises ZnS and/or ZnSe.

In some embodiments of the present invention, said shell comprises group 12 and group 16 elements of the periodic table. Preferably the shell comprises InP, ZnS and/or ZnSe, more preferably ZnS and/or ZnSe, even more preferably ZnSe. Preferred embodiments regarding the shell are specified above and below.

According to a specific embodiment, the shell preferably comprises at least 20% by weight, more preferably at least 40% by weight, even more preferably at least 60% by weight and most preferably at least 80% by weight ZnS based on the total weight of the shell. In a further embodiment, the shell preferably comprises at least 60% by weight, more preferably at least 80% by weight, even more preferably at least 90% by weight and most preferably at least 95% by weight ZnS in a specific layer of the shell.

According to a further embodiment, the shell preferably comprises at least 20% by weight, more preferably at least 40% by weight, even more preferably at least 60% by weight and most preferably at least 80% by weight ZnSe based on the total weight of the shell. In a further embodiment, the shell preferably comprises at least 40% by weight, more preferably at least 70% by weight, even more preferably at least 80% by weight and most preferably at least 90% by weight ZnSe in a specific layer of the shell.

Preferably the semiconducting nanosized material comprising at least three components being obtainable according to the method of the present invention are purified before a shell of a semiconductor is grown onto the semiconducting nanosized material comprising at least three components.

In an embodiment of the invention, the shell preferably has a thickness in the range of 0.3 nm to 20 nm, preferably 1.5 nm to 15 nm, more preferably 5 to 10 nm, measured by taking images on a 120 kV TEM and measuring the diameter of the quantum material for a sample of more than 50 particles and provided as arithmetic mean (number average). The measurement is preferably performed using imageJ software or the software mentioned below. Preferably, the shell thickness is calculated by subtracting the shelled particle thickness from the literature value of the MSCs e. g. 1.0 or 1.3 nm and/or the particle being used for shelling. Furthermore, the particle size of the shelled particles can be determined as mentioned above before shelling.

In some embodiments of the invention, the size of the overall structures of the quantum dots, is from 1 nm to 100 nm, more preferably, it is from 2 nm to 30 nm, even more preferably, it is from 5 nm to 15 nm. The size is measured according to the method mentioned above and is based on the arithmetic mean (number average).

The starting material for a preparing a semiconducting nanosized material having a shell preferably comprises a ligand as mentioned above and below.

The preparation of the shell is preferably achieved using a solvent. The solvent is not specifically restricted. Preferably, the solvent is selected from amines, aldehydes, alcohols, ketones, ethers, esters, amides, sulfur compounds, nitro compounds, phosphorus compounds, hydrocarbons, halogenated hydro-carbons (e.g. chlorinated hydrocarbons), aromatic or heteroaromatic hydrocarbons, halogenated aromatic or heteroaromatic hydrocarbons and/or (cyclic) siloxanes, preferably cyclic hydrocarbons, terpenes, epoxides, ketones, ethers and esters. Preferably a non-coordinating solvent is used.

Preferably, an alkane, more preferably a squalane is used as a solvent for achieving a shell. Preferably, an alkane having 6 to 46 carbon atoms, more preferably 8 to 40 carbon atoms, even more preferably 12 to 34 carbon atoms, most preferably 16 to 30 carbon atoms is used as a solvent. More preferably, the alkane being used as a solvent is a decane, dodecane, tetradecane, hexadecane, octadecane, eicosane, docosane, hexamethyltetracosane. The alkane may be linear or branched with branched alkanes such as squalane being preferred.

In an embodiment of the present invention, the preparation of the shell is preferably achieved by a reaction mixture comprising a solvent and the solvent comprises at least one alkene, preferably an alkene having 6 to 36 carbon atoms, more preferably 8 to 30 carbon atoms, even more preferably 12 to 24 carbon atoms, most preferably 16 to 20 carbon atoms. More preferably, the alkene is a 1-alkene, such as 1-decene, 1-dodecene, 1-Tetradecene, 1-hexadecene, 1-octadecene, 1-eicosene, 1-docosene. The alkene may be linear or branched.

In a further embodiment of the present invention, the preparation of the shell is preferably achieved by a reaction mixture comprising a solvent and the solvent comprises at least one phosphorus compound, such as phosphine compounds, preferably alkyl phosphine compounds having 3 to 108 carbon atoms, phosphine oxide compounds, preferably alkyl phosphine oxide having 3 to 108 carbon atoms and/or phosphonate compounds, more preferably an alkyl phosphonate compounds having 1 to 36 carbon atoms, preferably 6 to 30 carbon atoms, even more preferably 10 to 24 carbon atoms, most preferably 12 or 20 carbon atoms in the alkyl group. Preferably, Trioctylphosphine (TOP) is used as a solvent for the preparation of a shell.

In a further embodiment of the present invention, the preparation of the shell is achieved by a reaction mixture comprising a solvent and the solvent comprises at least amine compound, preferably a primary amine or a secondary amine having 6-36 carbon atoms, preferably 10 to 30, more preferably oleylamine (boiling point 348-350° C.), decyl amine (boiling point 216-218° C.), dodecyl amine (DDA; boiling point 247-249° C.), tetradecyl amine (TDA; boiling point 162° C./15 mmHg), hexadecyl amine (HDA; boiling point 330° C.), and octadecyl amine (ODA; boiling point 232° C./32 mmHg), dihexyl amine (boiling point 192-195° C.), dioctyl amine (boiling point 297-298° C.), didecyl amine (boiling point 179-180° C./2 mmHg), trihexyl amine (boiling point 263-265° C.), trioctyl amine (boiling point 365-367° C.), tridecyl amine (boiling point 265° C.), most preferably oleylamine.

Regarding the preparation step of the shell, amines are preferred in view of the other solvents mentioned above. In a further preferred embodiment, the solvent for the preparation of the shell comprises a mixture of an amine and a phosphorus compound.

Preferably, the reaction mixture for the preparation of the shell comprises at least 10% by weight of a solvent, more preferably at least 50% by weight, even more preferably at least 70% by weight, even more preferably at least 90% by weight. The residual is provided by the further components of the reaction mixture as described above and below.

Preferably, the reaction mixture for the preparation of the shell comprises an amine, preferably the reaction mixture comprises from 1% to 95% by weight of an amine, more preferably from 10% to 90% by weight, even more preferably from 30% to 85% by weight. The residual is provided by the further components of the reaction mixture as described above and below.

Preferably, the preparation of the shell is achieved by a reaction mixture comprising a solvent and the solvent exhibits a boiling point of at least 150° C., preferably of at least 200° C., more preferably of at least 250° C., even more preferably of at least 300° C., most preferably of at least 350° C.

Preferably, the preparation of the shell is achieved at a temperature above 110° C., preferably in the range of 110 to 500° C., more preferably above 150° C., even more preferably above 200° C. and most preferably above 220° C. In an embodiment of the present invention, the preparation of the shell is preferably achieved at a temperature in the range of 120 to 450° C., more preferably in the range of 150 to 400° C., even more preferably in the range of 180 to 360° C.

In a specific embodiment of the present invention, the shell is preferably prepared by mixing semiconducting nanosized material comprising at least three components and a first precursor and heating up the obtained mixture and then adding a second precursor, preferably the first precursor comprises an element of group 12 of the periodic table and the second precursor comprises an element of group 16 of the periodic table. Preferably, the first precursor comprises Zn, and the second precursor comprises S and/or Se. In a further embodiment the first precursor comprises an element of group 13 of the periodic table and a the second precursor comprises an element of group 15 of the periodic table, preferably, the first precursor comprises In, and the second precursor comprises P. Preferred embodiments regarding the first and second precursors concerning the preparation of the shell are provided below.

In a further embodiment of the present invention, the shell is preferably prepared by mixing semiconducting nanosized material comprising at least three components and a second precursor and heating up the obtained mixture and then adding a first precursor, preferably the first precursor comprises an element of group 12 of the periodic table and the second precursor comprises an element of group 16 of the periodic table. Preferably, the first precursor comprises Zn, and the second precursor comprises S, Se and/or the first precursor comprises an element of group 13 of the periodic table and a the second precursor comprises an element of group 15 of the periodic table, preferably, the first precursor comprises In, and the second precursor comprises P. Preferred embodiments regarding the first and second precursors concerning the preparation of the shell are provided below.

Preferably, the semiconductor precursor comprises a Zn compound and/or an In compound, preferably a Zn carboxylate, more preferably a zinc carboxylate having 2 to 30 carbon atoms, preferably 4 to 26 carbon atoms, even more preferably 8 to 22 carbon atoms, most preferably 10 to 18 carbon atoms, even more preferably a zinc carboxylate selected from the group consisting of Zn myristate, Zn palmitate, Zn laurate, Zn stearate, Zn oleate and/or an indium carboxylates, more preferably indium carboxylates having 2 to 30 carbon atoms, preferably 4 to 24 carbon atoms, even more preferably 8 to 20 carbon atoms, most preferably 10 to 18 carbon atoms even more preferably a indium carboxylate selected from the group consisting of In myristate, In palmitate, In laurate, In stearate, In oleate.

Preferably, the semiconductor precursor comprises a S compound, preferably a sulfur solution, a sulfur suspension, a alkylthiol, e. g. octanethiol, a alkylsilyl sulfur, and/or a alkylsilyl sulfur, e. g. bis(trimethyl silyl) sulfur, a Se compound, preferably a Se solution, Se suspension, a alkylselenol, e. g. octaneselenol, and/or a alkylsilyl selenium, e. g. bis(trimethyl silyl) selenium, and/or an P compound, preferably an alkylsilyl phosphine more preferably tris(trimethylsilyl)phosphine.

Preferably a sulfur solution, more preferably a S solution comprising a phosphorus containing solvent, e.g. trioctylphosphine is used as a semiconductor precursor.

Preferably, a Se suspension comprising a hydrocarbon solvent, e.g. an 1-alkene, such as 1-octadecene and/or an organic phosphine compounds, preferably alkyl phosphine compounds having 1 to 30 carbon atoms, preferably 1 to 10 carbon atoms, even more preferably 1 to 4 carbon atoms, most preferably 1 or 2 carbon atoms in the alkyl groups or aryl phosphine compounds having 6 to 30 carbon atoms, preferably 6 to 18 carbon atoms, even more preferably 6 to 12 carbon atoms, most preferably 6 or 10 carbon atoms in the aryl groups is used as a semiconductor precursor.

Preferably, an organic phosphine compound as mentioned above regarding the InP precursor, e.g. tris(trimethylsilyl) phosphine and similar materials having an aryl, and/or alkyl group instead of the methyl unit, such as tris(triphenylsilyl) phosphine, tris(triethylsilyl)phosphine, tris(diphenylmethylsilyl)phosphine, tris(phenyldimethylsilyl)phosphine, tris(triphenylsilyl)phosphine, tris(triethylsilyl)phosphine, tris (diethylmethylsilyl)phosphine, tris(ethyldimethylsilyl) phosphine dissolved in an organic solvent, preferably octadecene or squalane is used as a semiconductor precursor.

In another embodiment, the semiconducting nanosized material comprising at least three components being preferably prepared by a reaction mixture comprising a carboxylate compound in a first reaction step A) is reacted with a semiconductor precursor in a second reaction step B).

Preferably, the carboxylate compound being used in the first reaction step A) has 2 to 30 carbon atoms, preferably 4 to 26 carbon atoms, even more preferably 8 to 22 carbon atoms, most preferably 10 to 18 carbon atoms.

More preferably, the carboxylate compound being used in the first reaction step A) is a saturated carboxylate compound. The carboxylate compound could be added to the reaction mixture as a free acid or as a salt. Preferably, the carboxylate compound is added as a precursor, preferably an indium precursor wherein preferred indium precursors are disclosed above and below.

According to a further embodiment, the second reaction step B) is performed by heating up a composition comprising a first precursor, preferably Zn compound and/or an In compound, to a temperature above 50° C., preferably above 90° C. and a composition comprising the reaction product from the first reaction step A) and a second precursor, preferably a S and/or a Se and/or a P compound are injected into the composition comprising a first precursor.

Preferably, the second reaction step B) is performed by heating up a composition comprising a first precursor, preferably Zn compound and/or an In compound, to a temperature in the range of 50° C. to 400° C., and a composition comprising the reaction product from the first reaction step A) and a second precursor, preferably a S and/or a Se and/or a P compound are injected into the composition comprising a first precursor.

The composition comprising the reaction product from the first reaction step A) and a second precursor, preferably a S and/or a Se and/or a P is preferably kept to a temperature below 120° C., more preferably below 100° C., before mixing.

According to another embodiment, the second reaction step B) is performed by heating up a composition comprising a second precursor, preferably a S and/or a Se and/or a P compound, to a temperature above 200° C., preferably above 250° C. and a composition comprising the reaction product from the first reaction step A) and a first precursor, preferably Zn compound and/or an In compound, is injected into the composition comprising a second precursor.

According to another embodiment, the second reaction step B) is performed by heating up a composition comprising a second precursor, preferably a S and/or a Se and/or a P compound, to a temperature in the range of 200° C. to 400° C., more preferably to a temperature in the range of 250° C. to 350° C. and a composition comprising the reaction product from the first reaction step A) and a first precursor, preferably Zn compound and/or an In compound, is injected into the composition comprising a second precursor.

The composition comprising the reaction product from the first reaction step A) and a first precursor, preferably Zn compound and/or an In compound, is preferably kept to a temperature below 120° C., more preferably below 100° C., before mixing.

According to another embodiment, the second reaction step B) is performed by heating up a composition comprising a first precursor, preferably Zn compound and/or an In compound, a second precursor, preferably a S and/or a Se and/or a P compound, and reaction product from the first reaction step A) to a temperature above 50° C., preferably above 90° C., more preferably to a temperature in the range of 50° C. to 450° C., more preferably in the range of 200 to 400° C. Preferably, a composition comprising a first precursor, preferably Zn compound and/or an In compound, is added to the reaction mixture for performing the second reaction step B). Preferably, a composition comprising a second precursor, preferably a S and/or a Se and/or a P compound, is added to the reaction mixture for performing the second reaction step B). In this embodiment, the first and second precursor is additionally added to the composition comprising a first precursor, preferably Zn compound and/or an In compound, a second precursor, preferably a S and/or a Se and/or a P compound, and reaction product from the first reaction step A) in multiple portions.

The reaction product of the first reaction step A) can be purified before performing the second reaction step B) for preparing a shell. Preferred embodiments regarding the purification, especially the adding of a solvent and the precipitation are provided above and added by reference thereto.

In another aspect, the present invention also relates to a method for preparing quantum dots comprising a core/shell structure, wherein the method comprises following steps (a), (b) and (c) in this sequence.

(a) synthesis of a core in a solution,
(b) removing the extra ligands from the core
(c) coating the core with at least one shell layer using said solution obtained in step (b).

In some embodiments of the present invention, the surface of the quantum dots can be over coated with one or more kinds of surface ligands.

Without wishing to be bound by theory it is believed that such a surface ligands may lead to disperse the nanosized material in a solvent more easily. In addition, the surface ligand may improve the features of the quantum dots such as efficiency, quantum yield, wavelength of the peak maximum and full width half maximum (FWHM).

According to a specific embodiment of the method of the present invention, the semiconducting nanosized material comprising at least three components preferably comprises a ligand, preferably a carboxylate ligand, more preferably a carboxylate ligand having 2 to 30 carbon atoms, preferably 4 to 26 carbon atoms, even more preferably 8 to 22 carbon atoms, most preferably 10 to 18 carbon atoms, even more preferably a carboxylate ligand selected from the group consisting of myristate, palmitate, laurate, stearate, oleate.

In a specific embodiment of the present invention, the semiconducting nanosized material comprising at least three components and/or any nanosized material being produced or used to obtain the semiconducting nanosized material can be purified. This purification can be done as intermediate step or to obtain a purified quantum dots according to the present invention.

According to a special embodiment, the purification can be achieved by dispersing 0.1 to 10 equivalents of the crude solution in 1 equivalent of a solvent (by volume), preferably a hydrocarbon solvent, e. g. toluene, hexane, pentane or chloroform. Then, 0.5 to 20 equivalents (by volume) of a cleaning solution such as a ketone, alcohol, preferably acetone, methanol, ethanol or propanol, more preferably an ketone, e. g. acetone is preferably added to the composition. The resultant suspension is preferably centrifuged for a time and at a speed sufficient for a useful precipitation. E.g. good results are achieved with 5 min at a speed of 5000 rpm.

In some embodiments of the present invention, the cleaning solution comprises one compound selected from one or more members of the group consisting of ketones, such as, methyl ethyl ketone, acetone, methyl amyl ketone, methyl isobutyl ketone, and cyclohexanone; alcohols, such as, methanol, ethanol, propanol, butanol, hexanol, cyclo hexanol, ethylene glycol; and pentane; halogenated hydrocarbons, such as chloroform; xylene and toluene.

In a preferred embodiment of the present invention, the cleaning solution comprises three parts the crude solution with the QDs, the solvent and the anti-solvent. The solvent is typically a non-polar compound preferably an alkane or a benzene derivative such as toluene or a halogenated hydrocarbon, more preferably toluene, chloroform, hexane and pentane. The anti-solvent is typically a polar compound such as an alcohol, ester or nitrogen containing compound, preferably methanol, ethanol, isopropanol, butanol, ethyl acetate and acetonitrile. The ratios of the crude, solvent and antisolvent are in the ranges of 2.5:2.5:1 to 1:20:80.

In a preferred embodiment of the present invention, the cleaning solution comprises one or more of ketones to more effectively remove unreacted core precursors from the composition comprising a particulate material as mentioned above or any other reaction composition and remove e. g. the ligands leftovers.

More preferably, the cleaning solution contains one or more of ketones selected from the group consisting of methyl ethyl ketone, acetone, methyl amyl ketone, methyl isobutyl ketone, and cyclohexanone, and one more solvent selected from halogenated hydrocarbons, preferably chloroform, acetonitrile, ethyl acetate, xylene or toluene to remove unreacted core precursors from the composition comprising a particulate material as mentioned above or any other reaction composition and remove e. g. the ligands leftovers in the solution effectively.

More preferably, the cleaning solution contains one or more of ketones selected from methyl ethyl ketone, acetone, methyl amyl ketone, methyl isobutyl ketone, and cyclohexanone, and chloroform.

In some embodiments of the present invention, the mixing ratio of ketones: chloroform can be 1:2-20:1 in a molar ratio. Preferably it is 1:1-5:1 to remove unreacted core precursors from the composition obtained in a first step and/or the ligands contained in the composition obtained in second step as mentioned above or any other reaction composition and to remove e.g. the ligands leftovers in the solution.

More preferably, the cleaning removes the extra ligands and the unreacted precursor.

In another aspect, the present invention further relates to the use of the semiconducting nanosized material comprising at least three components, preferably the quantum dots (QD) of the present invention, the composition of the present invention or the formulation of the present invention in an electronic device, optical device or in a biomedical device.

A further subject matter of the present invention are the semiconducting nanosized material comprising at least three components, preferably quantum dots (QD) being obtainable by a method of the present invention as described above and below.

According to a preferred embodiment, the semiconducting nanosized material comprising at least three components, preferably the quantum dots may comprise a core/shell structure. Consequently, the QD may comprise a shell of a semiconductor.

Quantum dots (QD) are well known in the art as described above. Conventionally QD are a nanosized light emitting semiconductor material. According to the present invention, the term "nanosized" means the size in between 0.1 nm and 999 nm.

Thus, according to the present invention, the term "a nanosized light emitting semiconductor material" is taken to mean that the light emitting material which size of the overall diameter is in the range from 0.5 nm to 999 nm. And in case of the material has elongated shape, the length of the overall structures of the light emitting material is in the range from 0.5 nm to 999 nm.

According to the present invention, the term "nano sized" means the size of the semiconductor material itself without ligands or another surface modification, which can show the quantum size effect.

According to the present invention, a type of shape of the core of the nanosized light emitting material, and shape of the nanosized light emitting material to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped nanosized light emitting materials can be synthesized.

In some embodiments of the present invention, the semiconducting nanosized material comprising at least three components, preferably quantum dots (QD) preferably have a relative quantum yield of at least 10%, more preferably at least 20% and even more preferably at least 30% measured by calculating the ratio of the emission counts of the QD and the dye coumarin 153 (CAS 53518-18-6) and multiplying by the QY of the dye (54.4%) measured at 25° C.

In some embodiments of the present invention, the semiconducting nanosized material comprising at least three components, preferably quantum dots (QD) preferably have a relative quantum yield of at most 90%, more preferably at most 80%, even more preferably at most 70% and even more preferably at most 65% measured by calculating the ratio of the emission counts of the QD and the dye coumarin 153 (CAS 53518-18-6) and multiplying by the QY of the dye (54.4%) measured at 25° C.

In specific embodiments of the present invention, the semiconducting nanosized material comprising at least three components, preferably quantum dots (QD) preferably have a relative quantum yield in the range of 5% to 90%, more preferably in the range of 10 to 85%, even more preferably in the range of 20 to 80% and even more preferably in the range of 30 to 70% measured by calculating the ratio of the emission counts of the QD and the dye coumarin 153 (CAS 53518-18-6) and multiplying by the QY of the dye (55%) measured at 25° C.

The relative quantum yield is preferably calculated using absorbance and emission spectrum (excited at 350 nm), obtained using Shimadzu UV-1800 and Jasco FP-8300 spectrophotometer, using the following formula, with coumarin 153 dye in ethanol is used as a reference, with a quantum yield of 55%

$$QY = QY_{ref} \frac{n^2}{n_{ref}^2} \times \frac{I}{A} \times \frac{A_{ref}}{I_{ref}}$$

wherein the symbols have the following meaning
QY=Quantum Yield of the sample
$QY_{ref}$=Quantum Yield of the reference/standard
n=the refractive index of the sample solvent (especially ethanol)
$n_{ref}$=the refractive index of the reference/standard
I=the integral of the sample emission intensity as measured on the Jasco. Calculated as ∫I dv with I=intensity, v=wavelength.
A=is the percentage absorbance of the sample. The percentage of the sampling light that the sample absorbs.
$I_{ref}$=the integral of the reference emission intensity as measured on the Jasco. Calculated as ∫I dv with I=intensity, v=wavelength.
$A_{ref}$=is the percentage absorbance of the reference. The percentage of the sampling light that the reference absorbs.

The absorbance and emission spectrum is achieved at a temperature of about 25° C.

In a specific embodiment, the semiconducting nanosized material comprising at least three components, preferably quantum dots (QD) has a full width half maximum (FWHM) of at most 80 nm measured at 25° using a toluene solution, preferably a full width half maximum (FWHM) in the range of 30 to 60 nm.

Preferably, the semiconducting light emitting nanosized material, preferably quantum dots (QD) exhibit a peak maximum in the photoluminescence spectrum at a wavelength above 515 nm.

In a preferred embodiment, the semiconducting nanosized material comprising at least three components, preferably the quantum dots (QD) preferably exhibit a peak maximum in the photoluminescence spectrum at a wavelength in the range of 402 to 600 nm and a full width half maximum (FWHM) in the range of 10 nm to 80 nm, preferably in the range of 25 nm to 70, more preferably in the range of 30 nm to 60 nm, even more preferably in the range of 35 nm to 55 nm measured at 25° C. using a toluene solution.

Preferably, the determination of the full width half maximum (FWHM) is made with an appropriate data base preferably comprising at least 10, more preferably at least 20 and even more preferably at least 50 data points. The determination is preferably performed by using LabVIEW Software (LabVIEW 2017; May 2017) with the following VIs (Virtual Instrument):
1. 'Peak detector' for finding center wavelength and y-value (counts). The following parameters are preferably used: width: 10, threshold: maximum value of input data divided by 5.
2. Dividing the counts (y-value) at the center wavelength value (see item 1) by 2 giving the y-value for the half-width of the peak. The two points having this half-width y-value are found and the difference between their two wavelength values are taken to give the FWHM parameter.

In a very preferred embodiment, the semiconducting nanosized material comprising at least three components, preferably the QD preferably exhibit a peak maximum in the photoluminescence spectrum at a wavelength above 400 nm and a full width half maximum (FWHM) in the range of 10 nm to 80 nm, preferably in the range of 25 nm to 70, more preferably in the range of 30 nm to 60 nm, even more preferably in the range of 40 nm to 55 nm measured at 25° C. using a toluene solution.

Preferably, the data concerning the peak maximum in the photoluminescence is obtained using a toluene solution of quantum material with an optical density (OD) of 0.09 at the excitation wavelength of 350 nm on a JASCO spectrofluorometer. The FWHM of full-width-half-maximum is the width of the exciton peak measured at half the maximum emission counts.

Preferably, the semiconducting nanosized material comprising at least three components, preferably QD exhibit a ratio of the peak maximum to the peak minimum in the absorption spectrum of at least 1.5, more preferably at least 1.7, even more preferably of at least 1.85 and even more preferably of at least 1.95 measured at 25° C. using a toluene solution having an optical density (OD) of 0.09. The ratio of the peak maximum to the peak minimum is the ratio of the OD of the first exciton peak and the trough on the lower wavelength side of that peak. Preferably, the ratio of the peak maximum to the peak minimum in the absorption spectrum is related to the first exciton peak.

Preferably, the peak maximum of the semiconducting nanosized material comprising at least three components, preferably QD in the absorption spectrum is at a wavelength above 385 nm, more preferably above 390 nm. Preferably, the QD exhibit an Exciton peak maximum in the absorption spectrum at a wavelength in the range of 400 to 650 nm, more preferably in the range of 410 to 600 nm, in the absorption spectrum measured at 25° using a toluene solution.

Preferably, the semiconducting nanosized material comprising at least three components, preferably the QD are based on indium zinc phosphide (InZnP). Therefore, the present QD preferably comprise a measurable amount of InZnP. Preferably, the QD comprise a centre area of InZnP. More preferably, the centre area of the semiconducting nanosized material comprising at least three components, preferably of InZnP comprises a diameter in the range of 0.8 to 5.0 nm, preferably 0.9 nm to 3.0 nm, more preferably 1.0 to 1.5 nm. The size of the particles can be obtained by methods well known in the art. The particle size distribution is preferably assessed with Gatan Digital Micrograph software using images obtained from High Resolution Transmission Electron Microscopy (HRTEM) and provided as arithmetic mean (number average).

The sample preparation for performing the HRTEM can be performed by any conventional method. Preferably, the sample is purified before the measurement. E.g. 0.2 ml of the crude sample is dissolved in 0.2 ml of chloroform; 1.6 ml of acetone is then added and the mixture is precipitated by centrifuge (5 minutes, 5 Krpm). Then the precipitant is dissolved in 0.5 ml of chloroform, and 30 uL from this solution is dropped on a Cu/C TEM grid with ultrathin amorphous carbon layer. The grid is dried in vacuum at 80° C. for 1.5 h to remove the residues of the solvent as well as possible organic residues.

HRTEM and/or other TEM measurements are preferably carried out on a Tecnai F20 G2 machine equipped with EDAX Energy Dispersive X-Ray Spectrometer.

According to an embodiment of the present invention, said semiconducting light emitting nanoparticle preferably comprising a core and at least one shell layer, wherein the semiconducting light emitting nanoparticle preferably has the self-absorption value 0.35 or less, preferably, in the range from 0.30 to 0.01, more preferably, from 0.25 to 0.05, even more preferably, from 0.23 to 0.12.

The Self-absorption ("SA") value is calculated preferably according to the following procedure:

According to the present invention, the optical density (hereafter "OD") of the nanoparticles is preferably measured using Shimadzu UV-1800, double beam spectrophotometer, using toluene baseline, in the range between 350 and 800 nm.

The photoluminescence spectra (hereafter "PL") of the nanoparticles is preferably measured using Jasco FP fluorimeter, in the range between 460 and 800 nm, using 450 nm excitation.

The OD ($\lambda$) and PL ($\lambda$) are the measured optical density and the photoluminescence at wavelength of $\lambda$.

$OD_1$ represented by the formula (I) is the optical density normalized to the optical density at 450 nm, and $\alpha_1$ represented by formula (II) is the absorption corresponding to the normalized optical density.

$$OD_1 = \frac{OD(\lambda)}{OD(\lambda = 450 \text{ nm})} \quad (I)$$

$$a_1 = 1 - 10^{-OD_1} \quad (II)$$

$$SA = \frac{\int_0^\infty PL_1(\lambda)a_1(\lambda)d\lambda}{\int_0^\infty PL_1(\lambda)d\lambda} \qquad (III)$$

SA=self absorption.

The self-absorption value of the nanoparticles represented by formula (III) is preferably calculated based on the OD and PL measurement raw data.

It is believed that lower-self absorbance of the nanoparticles is expected to prevent the QY decrease in high emitter concentrations.

In another aspect, the present invention further relates to a composition comprising or consisting of the semiconducting nanosized material comprising at least three components, preferably the QD of the present invention, preferably semiconducting light emitting nanoparticle of the present invention and at least one additional material, preferably the additional material is selected from the group consisting of organic light emitting materials, inorganic light emitting materials, charge transporting materials, scattering particles, host materials, and matrix materials.

A further embodiment of the present invention is a formulation comprising or consisting of the semiconducting nanosized material comprising at least three components, preferably the QD of the present invention, and at least one solvent. Preferred solvents are mentioned above and below.

Preferably, the semiconducting nanosized material comprising at least three components have properties of a semiconducting light emitting nanoparticle.

Optical Medium

In another aspect, the present invention further relates to an optical medium comprising the nanosized light emitting material.

In some embodiments of the present invention, the optical medium can be an optical sheet, for example, a color filter, color conversion film, remote phosphor tape, or another film or filter.

According to the present invention, the term "sheet" includes film and/or layer like structured mediums.

Optical Device

In another aspect, the invention further relates to an optical device comprising the optical medium.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Definition of Terms

The term "semiconductor" means a material which has electrical conductivity to a degree between that of a conductor (such as copper) and that of an insulator (such as glass) at room temperature.

The term "organic" means any material containing carbon atoms or any compound that containing carbon atoms ionically bound to other atoms such as carbon monoxide, carbon dioxide, carbonates, cyanides, cyanates, carbides, and thiocyanates.

The term "emission" means the emission of electromagnetic waves by electron transitions in atoms and molecules.

The term "material" means any compound and/or substance having the features additionally mentioned for specifying the expression material.

The term "cluster" means a material having a specific composition of the different components.

The expression "quantum dot" means a semiconducting nanosized material being useful for any application. That is a quantum dot is designed as a material which can be used for the preparation of an optical media and/or the optical devices.

The expression "semiconducting nanosized material comprising at least three components" means a material having semiconducting properties and having a nanosize as mentioned above and comprising at least three components for forming a semiconductor, such as InZnP, InGaP, GaZnP, etc. as mentioned above and below. Preferred semiconducting nanosized material comprising at least three components can be used as quantum dots. However, the expression "semiconducting nanosized material comprising at least three components" includes any pre-product for obtaining quantum dots.

Advantages

The quantum dots according to the invention and the optical media and/or the optical devices, obtainable therefrom are distinguished over the prior art by one or more of the following surprising advantages:

1. The optical media and/or the optical devices obtainable using the quantum dots according to the invention exhibit very high stability and a very long lifetime compared with optical media and/or optical devices obtained using conventional quantum dots.
2. The quantum dots according to the invention can be processed using conventional methods, so that cost advantages can also be achieved thereby.
3. The quantum dots according to the invention are not subject to any particular restrictions, enabling the workability of the present invention to be employed comprehensively.
4. The quantum dots according to the invention provide a high color purity and a low FWHM.
5. The quantum dots according to the invention can be produced in a very rapid and easy manner using conventional methods, so that cost advantages can also be achieved thereby.
6. The quantum dots according to the invention are less toxic than conventional formulations and have a high environmental acceptability.
7. The quantum dots according to the invention show a high emission in the visual range of the electromagnetic radiation.
8. The quantum dots according to the invention show a high quantum yield.
9. The quantum dots according to the invention show a high absorption.
10. The quantum dots according to the invention show a low self-absorption.
11. The formation of InP quantum dots using InP MSCs as the precursor (which we term the "SSP Reaction"; SSP=single source precursor) results in the formation of InP QD populations with improved size distribution and better max/min ratios. When a shell of ZnSe is put onto these InP QDs very narrow FWHMs have been reached, 38 nm. However, the Quantum Yield (QY) of such shell materials is effected by the lattice mismatch between the InP and ZnSe or ZnS shell. One way to tune the lattice mismatch is to add Zn to the InP QD forming InZnP QDs.

Adding Zn Precursors to the SSP reaction and/or adding Zn to the InP MSCs and forming InZnP MSCs allows Zn to be introduced into the SSP reaction allows the formation of InZnP quantum dots. This allows the lattice mismatch of the final InZnP QDs to be tuned to give higher QYs whilst maintaining smaller particle size distribution and lower FWHM.

12. The addition of Zn should blue-shift the optical properties of the QD. Therefore, InZnP QDs with similar CWL to InP QDs will need to be larger. This could result in QDs that have a higher absorption at 450 nm.
13. The present QD are more stable due to their larger size.
14. The present QD are cheaper based on the lower Indium content per particle.
15. The present method provides compositions having a very high concentration of semiconducting nanosized material comprising at least three components, preferably quantum dots (QD). The high concentrations provide cost advantages with regard to the processing and the handling of the QD. Furthermore, these high concentrations are achieved without specific steps conventionally used for increasing the concentration.
16. The present method enables the use of very high concentrated reaction compositions for obtaining the present semiconducting nanosized material comprising at least three components. Therefore, the present method provides additional cost advantages.
16. The present method provides compositions having a very low content of by-products and semiconducting nanosized materials having a very defined composition and structure based on the lowering of by-products and precursors during the manufacturing process.
17. The present QD of the present invention are very clean and comprise very low amounts of by-products and precursors which is a very useful feature especially with regard to OLED applications and other uses having the need for high purity starting materials.

These above-mentioned advantages are not accompanied by an undue impairment of the other essential properties.

There is no prior art reporting the formation of InZnP QDs using the SSP reaction. There is prior art which describes the synthesis of InZnP quantum dots and further shelling of these particles. However, they do not use the MSCs as the InP source. In this invention, preferably specific MSCs are used and these are injected at high temperature together with InP MSCs to form InZnP QDs.

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not to be regarded merely as part of the embodiments of the present invention. For these features, independent protection can be sought in addition or as an alternative to each invention presently claimed.

The teaching on technical action disclosed in the present invention can be abstracted and combined with other examples.

The invention is explained in greater detail below with reference to a working example, but without being restricted thereby.

WORKING EXAMPLES

Working Example 1

Preparation of Zinc Chloride Oleylamine Solution 10 g of $ZnCl_2$ (99.999% trace metal basis) is weighed into a flask, 133 mL of oleylamine (80-90%) is then added. The oleylamine which has been previously pumped down under vacuum at 90° C. for 1 hour. The solution is heated to 120 C under vacuum on a Schlenk line for 1 h. The solution is then gradually heated to 200 C. The solution is held at this temperature until the salt is fully dissolved.

Working Example 2

Preparation of Zinc Stearate Oleylamine Solution 45.65 g of Zinc Stearate (10-12% Zn points) is weighed into a flask, 180 mL of oleylamine, which has been previously pumped down on a Schlenk line at 90 C under vacuum, is then added. The mixture is heated to 120 C under vacuum for 4 hrs on a Schlenk line.

Working Example 3

Preparation of Zinc Acetate Oleylamine ODE Solution 2.2053 g Zn Acetate (99.99% trace metal basis) are dissolved with 7.56 ml oleylamine and 22.44 ml ODE (C=0.4M). The mixture is degassed at 100oC under vacuum for 1.5 h.

Working Example 4

Preparation of TOP Se Solution 31.6 g of selenium (99.99% trace metal basis) is mixed with 200 ml of trioctylphosphine (97%) and stirred until the selenium dissolved. This is performed under inert atmosphere.

Working Example 5

Preparation of In(MA)$_3$ Solution

In a typical synthesis, 0.93 g (3.20 mmol) of indium acetate (99.99% trace metal basis) and 2.65 g 11.6 mmol of myristic acid (99%) are weighed out into a 100 mL, 14/20, three-neck round-bottom flask equipped with a thermowell, reflux condenser, and septum. The apparatus is evacuated with stirring and raised in temperature to 100° C. The solution is allowed to off-gas acetic acid under reduced pressure for approximately 12 h at 100° C. to generate the In(MA)$_3$ solution. Afterward, the flask is filled with nitrogen, and a 20 mL portion of dry toluene (99.8%) is added.

Working Example 6

Synthesis of InP MA MSCs from In(MA)$_3$ Solution and P(SiMe$_3$)$_3$

In a nitrogen filled glovebox, 465 µL of P(SiMe$_3$)$_3$ (98%) is added to 10 mL of dry toluene, drawn into a syringe and sealed with a rubber stopper. The In(MA)$_3$ flask is brought up to 110° C. and the P(SiMe$_3$)$_3$ solution is injected. The formation of MSCs is monitored via UV-vis of timed aliquots taken from the reaction solution until the MSCs is fully formed as indicated by no further changes in the UV-vis spectra. This procedure can be easily adapted for a wide variety of fatty carboxylic acids in place of myristic acid.

Working Example 7

InP MA MSCs Workup Procedure

After UV-vis confirmed formation of MSCs, the flask is cooled and then carefully evacuated until all of the toluene is removed. The flask is transferred into a nitrogen filled glovebox. The crude MSCs are resuspended in dry toluene. The toluene solution is centrifuged to remove insoluble materials. The now transparent supernatant is transferred to a second centrifuge tube. Dry acetonitrile (99.8%) is added to the solution to precipitate the clusters. The suspension is centrifuged. The supernatant is decanted and discarded and the MSCs are redissolved in a minimal amount of dry toluene. Again acetonitrile is added, and the suspension is centrifuged. This is repeated for a total of four cycles of precipitation.

Working Example 8

Measurement of MSC Concentration in MSC/Squalane Solution

The cleaned MSC precipitate from working example 6 is dissolved in squalane, that is previously heated to 120° C. for 1 hour under reduced pressure on a Schlenk line. The volume of squalane is chosen to give the required concentration of MSCs.

The MSCs are dissolved in squalane by stirring in a glove box. 40 µL of this solution is then placed in a 70 µL alumina TGA crucible with lid. The crucible is then placed in a METTLER TOLEDO TGA 2 instrument, and the measurement is performed in a nitrogen atmosphere with a flow rate of 20 ml·min$^{-1}$.

A segmented heating program is applied: Segment 1—heating from 50° C. to 120° C. at a rate of 20° C.·min$^{-1}$; Segment 2—isotherm at 120° C. for 10 min; Segment 3—heating from 120° C. to 600° C. at a rate of 10° C.·min$^{-1}$.

The first two segments are aimed to evaporate solvents other than squalane, and the third segment is used to analyze the ligands and squalane content in the sample.

By knowing the sample weight at the beginning of the third segment and the weight loss at the end of that segment, the organic/inorganic content of the sample is calculated by assigning the weight loss to the organic content of the sample (i.e. ligands and squalane). The remaining weight is assigned as inorganic content.

Working Example 9

Preparation of InZnP Quantum Dots by Injection of MSCs and Zn Precursors into Hot Solvent Synthesis of InZnP QDs from InZnP MA MSCs Between 1-400 mg of the InP MSCs are dissolved into 1 mL of squalane (99%) (which has been dried over CaH$_2$ and vacuum distilled). In a 3-neck flask under nitrogen on a Schlenk line, 2.5 mL of squalane is preheated to between 300 and 400° C. using a heating mantle with vigorous stirring. The InP MSC solution is rapidly injected into the squalane solution. At the same time a suspension of between 50 mg and 1 g of zinc oleate (99.99% trace metal basis) in 5 ml of squalane is injected. After one minute of growth, the 3-neck flask is raised out of the heating mantle and lowered into a room temperature silicon oil bath for rapid cooling.

Shell Synthesis

First, the InZnP QDs are precipitated from solution by adding dry toluene and dry ethanol in a 1:4 ratio. The solution is then centrifuged to precipitate the quantum dots. These dots are then redissolved in 1-Octadecene (ODE, 90%) and heated up to 180° C. for 20 min. Then, cation (1.2 mL of 0.4M Zn acetate in oleylamine and anion (0.275 mL of 2M TOP:Se or TOP:S) shell precursors are injected into the solution.

The solution is then heated by steps, followed by successive injections of cation (1.2 mL of 0.4M Zn(acetate) in oleylamine and anion (0.19 mL of 2M TOP:Se or TOP:S) shell precursors as described in table 1.

Finally, the obtained solution is cooled down to room temperature under inert conditions.

TABLE 1

| | Time [min] | | | | | | | |
|---|---|---|---|---|---|---|---|---|
| | 20 | 60 | 120 | 150 | 180 | 210 | 240 | 300 |
| Temp [° C.] Injection | 180 anion and cation | 200 | 220 cation | 240 anion | 280 cation | 320 anion | 320 cation | 320 end |

Working Example 10

Preparation of InZnP MSCs by Injection of MSCs into Zn Precursor

The preparation of the InP MSC as described in Working Example 6 is repeated. However, the post-treatment of InP MA MSC to form InZnP MSC is changed.

The InP MA MSCs, between 1-400 mg, are dissolved in 5 mL of 1-octadecene (ODE). The InP/ODE solution is injected into a flask containing 5 ml of ODE and between 50 mg -1 g of zinc oleate and heated to between 110-200° C. in less than 15 minutes. After between 10 minutes and 1 hour, the flask is removed from the heating mantle and allowed to cool. The MSCs are precipitated by 3 successive cycles of dry toluene and dry acetonitrile precipitation.

Working Example 11

Synthesis of InZnP QDs from InZnP MA MSCs

One-Pot Synthesis of InZnP MSCs

The preparation of the InP MSCs as described in Working Example 6 is repeated. However the InZnP MA quantum dots are obtained by reacting a In(MA)$_3$, P(SiMe$_3$)$_3$ and Zn— oleate solution.

In a nitrogen filled glovebox, 465 microL of P(SiMe$_3$)$_3$ is added to 10 mL of ODE, drawn into a syringe and sealed with a rubber stopper. The In(MA)$_3$ flask is brought up to between 110-150° C. and the P(SiMe$_3$)$_3$ solution is injected. The formation of MSCs is monitored via UV-vis of timed aliquots taken from the reaction solution until the MSCs had fully formed as indicated by no further changes in the UV-vis spectra. Then Zn-oleate (99.99% trace metal basis) between 50 mg-1 g suspended in 5 ml ODE is injected and the temperature is heated to between 130-250 C for between 10 minutes to 1 hr. The MSCs are then precipitated from the solution by the addition of dry acetonitrile (until turbidity is observed) and centrifugation. The precipitate is then dissolved in dry toluene and again precipitated by the addition of dry acetonitrile (until turbidity is observed) followed by centrifugation. This is repeated 3 times.

Working Example 12

Synthesis of InZnP QDs from InZnP MA MSCs

Between 1-400 mg of the InZnP MSCs (from Working Example 9 or Working Example 10) are dissolved into 1 mL of squalane (which has been dried over CaH$_2$ and vacuum distilled). In a 3-neck flask under nitrogen on a Schlenk line, 2.5 mL of squalane is preheated to between 300 and 400° C. using a heating mantle with vigorous stirring. The InZnP MSC solution is rapidly injected into the squalane solution. After one minute of growth, the 3-neck flask is raised out of the heating mantle and lowered into a room temperature silicon oil bath for rapid cooling.

Shell synthesis

First, the InZnP QDs are precipitated from solution by adding dry toluene and dry ethanol in a 1:4 ratio. The solution is then centrifuged to precipitate the quantum dots. These dots are then redissolved in 1-Octadecene (ODE) and heated up to 180° C. for 20 min.

Then, cation (1.2 mL of 0.4M Zn(acetate) in oleylamine and anion (0.275 mL of 2M TOP:Se or TOP:S) shell precursors are injected into the solution.

The solution is then heated by steps, followed by successive injections of cation (1.2 mL of 0.4M Zn(acetate) in oleylamine and anion (0.19 mL of 2M TOP:Se or TOP:S) shell precursors as described in table 2.

Finally, the obtained solution is cooled down to room temperature under inert conditions.

TABLE 2

| | Time [min] | | | | | | | |
|---|---|---|---|---|---|---|---|---|
| | 20 | 60 | 120 | 150 | 180 | 210 | 240 | 300 |
| Temp [° C.] Injection | 180 anion and cation | 200 | 220 cation | 240 anion | 280 cation | 320 anion | 320 cation | 320 end |

Working Example 13

Preparation of InZnP Quantum Dots by Injection of MSCs into a Hot Solution of Zn Precursor with Lower Amount of Zinc Precursor The preparation of the InP MSC as described in Working Example 6 is repeated. However the post-treatment of InP MA MSC to form InZnP MSC is changed.

0.185 gr of zinc stearate are put into 50 mL, 14/23, four-neck round-bottom flask. The flask is connected to a reflux condenser on a Schlenk line and is evacuated under reduced pressure, 5 ml of distilled squalane are injected into it. The apparatus is evacuated at 90° C. with stirring (pressure is lowered from 100 mtorr to 40 mtorr during 1 hour) and heated to 375° C. under argon. InP MA MSC that had been cleaned by 5 repeated cycles using dry toluene and dry acetonitrile such that the organic content of the MSCs is 64%, are dissolved in distilled squalane such that the inorganic content in 0.583 ml is 50.6 mg (according to TGA measurements). To 0.583 ml of this solution a further 1.82 ml of distilled squalane is added. 2 ml of the injection solution are injected to the flask at 375° C. after 1 minute the mantle is removed and the flask is cooled to room temperature by cooling with a heat gun.

Results:

Exciton at 476 nm with max/min of 1.5 (see FIG. 1). There is emission and a QY of 4.3% is calculated, using coumarine (c153) as the reference dye—FIG. 2.

Working Example 14

Preparation of InZnP Quantum Dots by Injection of MSCs into a Hot Solution of Zn Precursor with Larger Amount of Zinc Precursor The preparation of the InP MSC as described in Working Example 6 is repeated. However the post-treatment of InP MA MSC to form InZnP MSC is changed.

0.74 gr of zinc stearate are put into 50 mL, 14/23, four-neck round-bottom flask. The flask is connected to a reflux condenser and is evacuated, and 5 ml of distilled squalane is injected into it. The apparatus is evacuated at 90° C. with stirring (pressure is lowered from 100 mtorr to 40 mtorr during 1 hour) and heated to 375° C. under argon. InP MA MSC that had been cleaned by 5 repeated cycles using toluene and acetonitrile such that the organic content of the MSCs is 64% are dissolved in distilled squalane such that the inorganic content in 0.583 ml is 50.6 mg (according to TGA measurements). To 0.583 ml of this solution a further 1.82 ml of distilled squalane is added.

2 ml of the injection solution are injected to the flask at 375° C. after 1 minute the mantle is removed and the flask is cooled to room temperature by blowing air with a fan.

Figure 2:
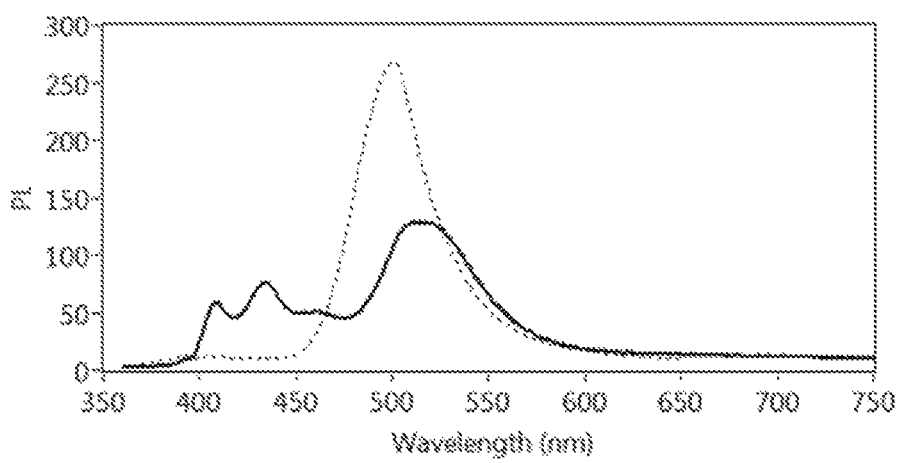
FIG. 2 illustrates emission and a QY of 4.3% which is calculated, using coumarine (c153) as the reference dye.
Figure 2:
Figure 2:

Results:
Exciton at 456 nm with max/min of 1.53 (see FIG. 1). There is emission and a QY of 5.1% is calculated, using coumarine (C153) as a reference dye (FIG. 2)

Shell Synthesis 6.5 ml of the crude solution of Working Example 6 are dissolved in 14 ml of dry toluene in the glove box. The mixture had 28 ml dry EtOH added, followed by centrifugation: 10 min, 6000 rpm. The precipitate is dissolved again with 14 ml of toluene and precipitated again with 21 ml dry EtOH and centrifugation: 10 min, 6000 rpm. The InZnP cores are dried under argon in a glove box.

In the glove box the InZnP cores are dissolved in 2.5 ml oleylamine and 0.4 ml toluene, then it is transferred to a 50 ml round bottom flask with 0.077 g $ZnCl_2$ and 0.275 ml Se-TOP solution from working example 3. The flask is vacuumed at 50° C. on a Schlenk line (until pressure of ~80mTorr). The mixture is then heated under argon to 180° C. for 30 min. Then the reaction is heated to 200° C. for additional 30 min. Separately a solution of $Zn(ac)_2$ in oleylamine/ODE, as described in working example 3 is heated on hot plate under argon. 1.2 ml of this $Zn(ac)_2$ in oleylamine/ODE solution are added dropwise (over 4 min) and the temperature is raised to 220° C. for 30 min. Then 0.19 ml of Se-TOP are injected slowly (~1,5 min) and the flask is heated to 240° C. for 30 min. 1.2 ml of $Zn(ac)_2$ in oleylamine/ODE is injected (~3 min) and the flask is heated to 280° C. After 30 min from the last injection (~258° C.), 0.19 ml of Se-TOP are injected slowly (~1 min) and the flask is heated to 320° C. for 30 min. 1.2 ml of $Zn(ac)_2$ (zinc acetate) in oleylamine/ODE are injected (~5 min, at ~300° C.) and the flask is maintained at 320° C. for additional 60 min.

At the end of the reaction a sample of the reaction solution had insoluble solids removed by dissolving it in toluene and then centrifuging the solution. The emission of the supernatant is measured and found to have a peak wavelength of 551 nm, with an FWHM of 42 nm. The quantum yield is 37%.

Reference Example 1

A 50 mL, 14/23, four-neck round-bottom flask equipped with a reflux condenser is evacuated, and 5 ml of distilled squalane is injected into it. The apparatus is evacuated at 90° C. with stirring (pressure is lowered from 100 mtorr to 40 mtorr during 1 hour) and heated to 375° C. under argon. InP MA MSC that had been cleaned by 5 repeated cycles using dry toluene and dry acetonitrile such that the organic content of the MSCs is 64%, are dissolved in distilled squalane such that the inorganic content in 0.583 ml is 50.6 mg (according to TGA measurements). To 0.583 ml of this solution a further 1.82 ml of distilled squalane is added. 2 ml of the injection solution are injected to the flask at 375° C. after 1 minute the mantle is removed and the flask is cooled to room temperature with a fan.

Results:
Exciton at 556 nm with max/min of 1.25 (see FIG. 1). The emission is negligible Working Example 15

Preparation of InZnP QDs by the injection of InP MSCs into Hot Zn Precursor and the Subsequent Growth of the QDs The preparation of the InP MSC as described in Working Example 6 is repeated. However the post-treatment of InP MA MSC to form InZnP MSC is changed.

Preparation of Injection Solution

InP MA MSCs that had been cleaned by 5 repeated cycles using toluene and acetonitrile such that the organic content of the MSCs is 64% are dissolved in distilled squalane such that the inorganic content is 118.2 mg/ml. 3.4 ml of this solution are further diluted by an additional 6.2 ml of distilled squalane.

Preparation of the Additions Solution 1.47 ml of the MSCs solution in squalane with an inorganic content of 118.2 mg/ml are mixed with 23.5 ml of squalane. Each addition had a volume of 6.5 ml.

Formation of InZnP QDs 1.48 g of zinc stearate are put into 50 mL, 14/23, four-neck round-bottom flask. The flask is connected to a reflux condenser, connected to a Schlenk line and is then evacuated, and 40 ml of distilled squalane are injected into it.

The apparatus is evacuated at 110° C. with stirring (pressure is lowered from 200 mtorr to 100 mtorr during 2 hours) and heated to 375° C. under argon.

8 ml of the injection solution are injected to the flask at 375° C., using a two 14 gauge needles and 6 ml syringes; after 1 minute the mantle is removed and the flask is cooled to 200° C. by fan, then heated to 265° C. and then the additions are added 14 and 18 minutes after the initial injection.

After 22 minutes the mantle is removed and the flask is cooled by fan.

Results:
Exciton at 493 nm with max/min of 1.97. After cooling the sample is measured in anhydrous toluene: exciton at 493 nm and max/min of 2.01

Work up of the InZnP Cores.

In a glove box 20 ml of the cores dissolved by 40 ml of dry toluene, the solution is stirred vigorously. The vial containing the solution is then closed with a rubber septum and centrifuged, 5000 rpm for 5 minutes. The precipitate is removed and the supernatant is run through a 20 micron PTFE filter under inert conditions. This is repeated 4 times. 80 ml of ethanol are added and the solution is precipitated by centrifugation, 500 rpm for 5 minutes inside a closed vial with an inert atmosphere. clear. The precipitate is then redissolved in 60 ml of dry toluene, 75 ml of dry ethanol are added followed by centrifugation and precipitation. The precipitate is redissolved once more in 7 ml of toluene. Lots for shelling are prepared by taking 1.35 ml of this solution.

Shell Synthesis

In a glove box 0.085 g $ZnCl_2$ is weighed out into a 4-neck 50 ml flask with stirrer. One lot of InZnP QDs are dissolved in 1 ml of anhydrous toluene and added to the flask. 4.8 ml pumped oleylamine are added do the flask. The flask is then connected to a Schlenk line without exposing it to ambient atmosphere. The solution is put under reduced pressure for 1 hour at room temperature. The solution is then heated to 250° C. under Argon and held for 30 minutes at this temperature. The solution is cooled to 180° C. Then 2.6 mL of the ZnCl$_2$ in oleylamine solution is injected into the flask, and after the temperature recovered to 180° C. 0.72 mL of 2M TOP:Se solution are injected dropwise. After 30 minutes at 180° C. the flask is heated to 200° C. After 30 minutes the flask is heated to 320° C. At 320° C. 3.1 mL of 0.4M solution of Zn(St)$_2$ in oleylamine are injected to the flask (dropwise). After 180 min at 320° C. the mantle is removed and the solution is cooled down to room temperature (RT) and stored in glove box.

Results

Final Particle Size: 10 nm (inorganics), 15 nm hydrodynamic diameter

CWL, QY, FWHM: 570 nm, 60%, 39 nm

Max/Min: 2.0

Self-absorption: 0.162

Working Example 16

Preparation of InGaP Cores

Preparation Gallium Oleate (Ga(Oleate)3) Stock Solution in ODE:

In a glove box, 0.89 g GaCl$_3$ (99.999% trace metal basis) are weighted into a 250 ml round bottom flask with 6.37 ml oleic acid and 40 ml ODE. The flask is mounted on a schlenck line and is vacuumed at 50° C. for few minutes. Then the flask is heated to 140° C. for ~1 h under Ar. The flask is cooled to room temperature and stored in glove box.

Preparation of the Injection Solution:

Clean InP MSCs are dissolved in squalane to give a concentration of 84 mg of MSCs in 10 ml of squalane.

Preparation of the Additions Solution:

A solution of 84 mg of MSCs in 10 ml of squalane is mixed with 2.3 ml of the Ga(OlAc)$_3$ solution.

Formation of InGaP QDs:

InGaP SSP cores are synthesized in the following method: 1.16 ml of the Ga(OlAc)$_3$ in ODE solution and 8.84 ml of distilled squalane are placed in a 100 ml round-bottom flask. The flask is connected to a Schlenk line and vacuumed for 5 minutes, then the flask is heated to 375° C. under argon. 3 ml of the injection solution is injected into the flask. After 1 min the flask is cooled down fast to 200° C. by removing the mantle, and blowing air by fan. The flask is then re-heated to 265° C., and then 2.5 ml portions of the additions solution is injected at the following times (in minutes, counted from the initial injection): 20, 24, 28, 32, 36, 40, 44. After 48 min and the flask is cooled down to room temperature by removing the mantle and blowing air by fan.

Working Example 17

Preparation of In$_x$Zn$_y$Ga$_{1-y}$P Cores

Preparation of Stock Solution of 0.117M Zn(St)$_2$ in Squalane:

1.48 g of Zn Stearate and 20 ml of distilled squalane are put into a 50 ml round-bottom flask, which is connected to a schlenk line via a condenser. The flask is heated to 110° C. for 2 hours under vacuum and then cooled down to room temperature by removing the mantle and blowing air by fan; the turbid solution is stored in glove box.

Synthesis of Preparation of In$_x$Zn$_y$Ga$_{1-y}$P Cores

InZnGaP SSP cores are synthesized in the following method: The same as Working Example 6 but adding Zn precursor solution (such as Zn-stearate and others) with the Ga solution in the appropriate ratio (0<y<1).

The invention claimed is:

1. A method for synthesizing a semiconducting nanosized material comprising at least three components, comprising reacting in a first step a first precursor and a second precursor to form a nanosized material, which formed nanosized material is then in a second step reacted with a third precursor to obtain a semiconducting nanosized material comprising at least three components, wherein the first precursor is a source of an element of the group 13 of the periodic table;

the second precursor is a source of an element of the group 15 of the periodic table;

and the third precursor is a Zn, Cd or a Ga source.

2. The method according to claim 1, wherein the nanosized material of the first step is injected to a composition comprising the third precursor.

3. The method according to claim 2, wherein the nanosized material of the first step is injected to a composition comprising the third precursor in at least two portions.

4. The method according to claim 1, wherein the nanosized material of the first step is reacted with the third precursor in a concentration of at least 0.1 mg/ml.

5. The method according to claim 1, wherein the molar ratio of third precursor to the second precursor is in the range of 10:1 to 1:15.

6. The method according to claim 1, wherein a magical size cluster is formed in said first step.

7. The method according to claim 6, wherein the preparation of the magical size cluster is achieved in the presence of a carboxylate compound.

8. The method according to claim 6, wherein the preparation of the magical size cluster is achieved in the presence of a carboxylate compound having 2 to 30 carbon atoms.

9. The method according to claim 1, wherein the second step is performed at a reaction temperature of 100° C. to 500° C.

10. The method according to claim 1, wherein the nanosized material of the first step is purified before the second reaction step is performed.

11. The method according to claim 1, wherein said nanosized material formed in the first step is used as a single source precursor.

12. The method according to claim 1, wherein a shell of a semiconductor is grown onto the semiconducting nanosized material comprising at least three components.

13. The method according to claim 12, wherein the shell comprises InP, ZnS and/or ZnSe.

14. The method according to claim 12, wherein the semi-conducting nanosized material comprising the at least three components are purified before a shell of a semiconductor is grown onto the semiconducting nanosized material comprising at least three components.

15. The method according to claim 12, wherein the preparation of the shell is achieved by a reaction mixture comprising a solvent and the solvent comprises at least amine compound.

16. The method according to claim 12, wherein the shell comprises ZnS and/or ZnSe.

17. The method according to claim 12, wherein the preparation of the shell is achieved by a reaction mixture comprising a solvent and the solvent comprises at least amine compound selected from the group consisting of oleylamine, dedecyl amine, tetradecyl amine, hexadecyl amine and octadecyl amine.

18. The method according to claim 1, wherein the nanosized material of the first step is selected from the group consisting of InP, InAs, InSb, GaP, GaAs, GaSb, magic sized clusters, InP magic sized cluster, $In_{37}P_{20}(O_2CR^1)_{51}$, wherein the $O_2CR^1$ of the $In_{37}P_{20}(O_2CR^1)_{51}$ is —$O_2CCH_2$Phenyl, or a substituted or unsubstituted fatty acid selected from the group consisting of hexanoate, heptanoate, octanoate, nonanoate, decanoate, undecanoate, dodecanoate, tridecanoate, tetradecanoate, pentadecanoate, hexadecanoate, heptadecanoate, octadecanoate, non-adecanoate, icosanoate and oleate.

19. The method according to claim 1, wherein the first precursor is a source of an element of the group 13 of the periodic table, which is a salt of the element of the group 13 of the periodic table, and said element of the group 13 is In, Ga or a mixture of thereof;

the second precursor is a source of an element of the group 15 of the periodic table, and said element of the group 15 is P, As or a mixture of thereof; and the third precursor is a Zn, Cd or a Ga source, and is a material selected from one or more members of the group consisting of Zinc salts, Cadmium salts, Gallium salts, Zinc halogenides, Cadmium halogenides, Gallium halogenides, Zinc carboxylates, Cadmium carboxylates, Gallium carboxylates, $ZnCl_2$, $ZnBr_2$, $ZnI_2$, $Zn(O_2CR)_2$ wherein R is a $C_1$ to $C_{25}$ group, $GaCl_3$, $GaBr_3$, $GaCl_3$, $Ga(O_2CR)_3$ wherein R is a $C_1$ to $C_{25}$ group, Zinc acetate, Zinc myristate, Zinc stearate, Gallium acetate, Gallium myristate, Gallium stearate and mixtures thereof.

20. The method according to claim 1, wherein the nanosized material of the first step is reacted with the third precursor in a concentration of at least 1.0 mg/ml.

21. The method according to claim 1, wherein the molar ratio of third precursor to the second precursor is in the range of 10:1 to 1.5:1.

22. The method according to claim 1, wherein a magical size cluster is formed in said first step comprising indium phosphide.

23. The method according to claim 1, wherein the second step is performed at a reaction temperature of 150° C. to 380° C.

24. A method for synthesizing a semiconducting nanosized material comprising at least three components, comprising
a) providing a III-V semiconducting nanosized material;
b) providing a third precursor, which is a Zn, Cd or a Ga source;
c) reacting the III-V nanosized material with the third precursor to achieve a semiconducting nanosized material comprising at least three components.
wherein the III-V semiconducting nanosized material is selected from the group consisting of InP, InAs, InSb, GaP, GaAs, GaSb, magic sized clusters, InP magic sized cluster, $In_{37}P_{20}(O_2CR^1)_{51}$, wherein the $O_2CR^1$ of the $In_{37}P_{20}(O_2CR^1)_{51}$ is —$O_2CCH_2$Phenyl, or a substituted or unsubstituted fatty acid selected from the group consisting of hexanoate, heptanoate, octanoate, nonanoate, decanoate, undecanoate, dodecanoate, tridecanoate, tetradecanoate, pentadecanoate, hexadecanoate, heptadecanoate, octadecanoate, non-adecanoate, icosanoate and oleate.

25. A method for synthesizing a semiconducting nanosized material comprising at least three components, comprising
a) providing a III-V semiconducting nanosized material;
b) providing a third precursor, which is a Zn, Cd or a Ga source;
c) reacting the III-V nanosized material with the third precursor to achieve a semiconducting nanosized material comprising at least three components.

26. The method according to claim 25, wherein the III-V semiconducting nanosized material is selected from the group consisting of InP, InAs, InSb, GaP, GaAs, GaSb, magic sized clusters, InP magic sized cluster, $In_{37}P_{20}(O_2CR^1)_{51}$, wherein said $O_2CR^1$ of the $In_{37}P_{20}(O_2CR^1)_{51}$ is —$O_2CCH_2$Phenyl, or a substituted or unsubstituted fatty acid.

* * * * *